(12) United States Patent
Kovac

(10) Patent No.: US 10,277,168 B2
(45) Date of Patent: Apr. 30, 2019

(54) STACKED POWER AMPLIFIER POWER CONTROL

(71) Applicant: pSemi Corporation, San Diego, CA (US)

(72) Inventor: David Kovac, Arlington Heights, IL (US)

(73) Assignee: pSemi Corporation, San Diego, CA (US)

( * ) Notice: Subject to any disclaimer, the term of this patent is extended or adjusted under 35 U.S.C. 154(b) by 0 days.

(21) Appl. No.: 15/879,273

(22) Filed: Jan. 24, 2018

(65) Prior Publication Data

US 2018/0254745 A1 Sep. 6, 2018

Related U.S. Application Data

(63) Continuation-in-part of application No. 15/451,184, filed on Mar. 6, 2017, now Pat. No. 9,960,737.

(51) Int. Cl.
*H03F 1/22* (2006.01)
*H03F 1/02* (2006.01)
(Continued)

(52) U.S. Cl.
CPC ............ *H03F 1/0222* (2013.01); *G05F 1/56* (2013.01); *H03F 1/0261* (2013.01); *H03F 1/223* (2013.01);
(Continued)

(58) Field of Classification Search
CPC ....................................................... H03F 1/22
(Continued)

(56) References Cited

U.S. PATENT DOCUMENTS

| 6,838,944 B2 * | 1/2005 | Franca-Neto | ........... H03F 1/223 330/305 |
|---|---|---|---|
| 7,276,976 B2 | 10/2007 | Oh et al. | |

(Continued)

OTHER PUBLICATIONS

Choe, Henry, Office Action received from the USPTO dated Nov. 30, 2017 for U.S. Appl. No. 15/451,184, 10 pgs.

(Continued)

*Primary Examiner* — Henry Choe
(74) *Attorney, Agent, or Firm* — Jaquez Land Greenhaus LLP; Martin J. Jaques, Esq.; Alessandro Steinfl, Esq.

(57) ABSTRACT

Systems, methods and apparatus for efficient power control and/or compensation with respect to a varying supply voltage of an RF amplifier for amplification of a constant envelope RF signal are described. A reduction in a size of a pass device of an LDO regulator is obtained by removing the pass device of the LDO regulator from a main current conduction path of the RF amplifier. Power control and/or compensation is provided by varying one or more gate voltages to cascoded transistors of a transistor stack of the RF amplifier according to a power control voltage. Various configurations for controlling the gate voltages are presented by way of a smaller size LDO regulator or by completely removing the LDO regulator. In a case where a supply voltage to the transistor stack varies, such as in a case of a battery, a compensation circuit is used to adjust the power control voltage in view of a variation of the supply voltage, and therefore null a corresponding drift/variation in output power of the RF amplifier.

21 Claims, 23 Drawing Sheets

(51) Int. Cl.
*H03F 3/195* (2006.01)
*H03F 3/213* (2006.01)
*G05F 1/56* (2006.01)
*H03F 1/30* (2006.01)
*H03F 3/24* (2006.01)

(52) U.S. Cl.
CPC ............. *H03F 1/301* (2013.01); *H03F 3/195* (2013.01); *H03F 3/213* (2013.01); *H03F 3/245* (2013.01); *H03F 2200/102* (2013.01); *H03F 2200/18* (2013.01); *H03F 2200/264* (2013.01); *H03F 2200/267* (2013.01); *H03F 2200/375* (2013.01); *H03F 2200/451* (2013.01); *H03F 2200/61* (2013.01)

(58) Field of Classification Search
USPC .................................................. 330/311, 310
See application file for complete search history.

(56) References Cited

U.S. PATENT DOCUMENTS

| | | | |
|---|---|---|---|
| 7,319,220 B2 * | 1/2008 | Soltesz | H03F 1/08 250/214 A |
| 7,551,036 B2 | 6/2009 | Berroth et al. | |
| 7,737,790 B1 | 6/2010 | Chen et al. | |
| 7,741,910 B2 | 6/2010 | Wong | |
| 7,786,807 B1 | 8/2010 | Li et al. | |
| 7,889,005 B2 | 2/2011 | Simon | |
| 8,487,706 B2 | 7/2013 | Li et al. | |
| 8,779,860 B2 * | 7/2014 | Jeon | H03F 1/223 330/311 |
| 8,847,689 B2 | 9/2014 | Zhao et al. | |
| 9,252,713 B2 * | 2/2016 | Hur | H03F 1/0211 |
| 9,716,477 B2 * | 7/2017 | Wagh | H03F 3/211 |
| 9,857,818 B1 * | 1/2018 | Adamski | G05F 1/595 |
| 9,960,737 B1 | 5/2018 | Kovac | |
| 10,187,013 B2 | 1/2019 | Kovac | |
| 2002/0084855 A1 | 7/2002 | Kwon et al. | |
| 2004/0085138 A1 * | 5/2004 | Franca-Neto | H03F 1/223 330/311 |
| 2005/0007200 A1 | 1/2005 | Inoue et al. | |
| 2006/0202760 A1 | 9/2006 | Simon | |
| 2006/0226910 A1 | 10/2006 | Tanoi | |
| 2007/0228257 A1 * | 10/2007 | Soltesz | H03F 1/08 250/214 A |
| 2007/0296501 A1 | 12/2007 | Matsui | |
| 2011/0043284 A1 | 2/2011 | Zhao et al. | |
| 2012/0139635 A1 * | 6/2012 | Ho | H03G 1/007 330/278 |
| 2013/0093520 A1 | 4/2013 | Roux et al. | |
| 2015/0244322 A1 * | 8/2015 | Hur | H03F 1/0211 330/296 |
| 2015/0249437 A1 | 9/2015 | Morishita et al. | |
| 2018/0254746 A1 | 9/2018 | Kovac | |

OTHER PUBLICATIONS

Choe, Henry, Notice of Allowance received from the USPTO dated Jan. 16, 2018 for U.S. Appl. No. 15/451,184, 45 pgs.
Kovac, David, Preliminary Amendment filed in the USPTO dated Jun. 14, 2017 for U.S. Appl. No. 15/451,184, 4 pgs.
Kovac, David, Response filed in the USPTO dated Dec. 12, 2017 for U.S. Appl. No. 15/451,184, 12 pgs.
Goethals, Filip, International Search Report and Written Opinion received from the EPO dated Mar. 13, 2018 for appln. No. PCT/US2017/068052, 11 pgs.
Choe, Henry, Office Action received from the USPTO dated Sep. 10, 2018 for U.S. Appl. No. 15/882,933, 17 pgs.
Choe, Henry, Notice of Allowance received from the USPTO dated Nov. 30, 2018 for U.S. Appl. No. 15/882,933, 14 pgs.
Matthys, Griet, Notification Concerning Informal Communications with Applicant received from the EPO dated Jan. 11, 2019 for appln. No. PCT/US2017/068052, 3 pgs.

\* cited by examiner

FIG. 1  *PRIOR ART*

STACKED POWER AMPLIFIER POWER CONTROL

CROSS-REFERENCE TO RELATED APPLICATIONS—CLAIM OF PRIORITY

The present application is a Continuation-in-part (CIP) of U.S. application Ser. No. 15/451,184, filed on Mar. 6, 2017, entitled "Stacked PA Power Control", the disclosure of which is incorporated herein by reference in its entirety.

The present application may be related to U.S. patent application Ser. No. 15/415,768, filed on Jan. 25, 2017, entitled "LDO with Fast Recovery from Saturation", the disclosure of which is incorporated herein by reference in its entirety. The present application may also be related to U.S. Pat. No. 9,857,818, issued on Jan. 2, 2018, entitled "Improved Biasing for Lower $R_{ON}$ of LDO Pass Devices", the disclosure of which is incorporated herein by reference in its entirety. The present application may also be related to U.S. Pat. No. 7,248,120, issued on Jul. 24, 2007, entitled "Stacked Transistor Method and Apparatus", the disclosure of which is incorporated herein by reference in its entirety. The present application may also be related to Published US Application No. 2015/0270806 A1, published Sep. 24, 2015, entitled "Bias Control for Stacked Transistor Configuration", the disclosure of which is incorporated herein by reference in its entirety. The present application may also be related to U.S. Pat. No. 9,219,445 entitled "Optimization Methods for Amplifiers with Variable Supply Power", issued Dec. 22, 2015, the disclosure of which is incorporated herein by reference in its entirety. The present application may also be related to U.S. Pat. No. 8,987,792 B2, entitled "Merged Active Devices on a Common Substrate", issued Mar. 24, 2015, the disclosure of which is incorporated herein by reference in its entirety. The present application may also be related to U.S. Pat. No. 8,487,706 B2 entitled "Stacked Linear Power Amplifier with Capacitor Feedback and Resistor Isolation", issued Jul. 16, 2013, the disclosure of which is incorporated herein by reference in its entirety. The present application may also be related to U.S. application Ser. No. 14/945,323, entitled "Butted Body Contact for SOI Transistor", filed on Nov. 18, 2015, the disclosure of which is incorporated herein by reference in its entirety. The present application may also be related to U.S. Pat. No. 9,590,674, issued Mar. 7, 2017, entitled "Semiconductor Devices with Switchable Ground-Body Connection", the disclosure of which is incorporated herein by reference in its entirety. The present application may also be related to U.S. application Ser. No. 15/078,930, entitled "Butted Body Contact for SOI Transistor", filed on Mar. 23, 2016, the disclosure of which is incorporated herein by reference in its entirety. The present application may also be related to Published US Application No. US 2014/0184336 A1, published Jul. 3, 2014, entitled "Amplifier Dynamic Bias Adjustment for Envelope Tracking", the disclosure of which is incorporated herein by reference in its entirety. The present application may also be related to Published US Application No. 2014/0184335 A1, entitled "Amplifiers Operating in Envelope Tracking Mode or Non-Envelope Tracking Mode", the disclosure of which is incorporated herein by reference in its entirety. The present application may also be related to Published US Application No. 2014/0184337 A1, entitled "Control Systems and Methods for Power Amplifiers Operating in Envelope Tracking Mode", the disclosure of which is incorporated herein by reference in its entirety.

TECHNICAL FIELD

The present application generally relates to electronic circuits, and more specifically to output power control and compensation of a stacked amplifier for applications where a constant envelope input signal is amplified and/or a supply voltage to the amplifier may vary and/or drift.

BACKGROUND

In order to desensitize performance of CMOS amplifier circuits with respect to variation in their supply voltages, the amplifier circuits can be designed so that their quiescent current stays constant over a range of supply voltages, or so that the quiescent current is proportional to temperature (PTAT). However, in some applications, the performance of the amplifier can still be sensitive to the supply voltages. For example, a CMOS power amplifier biased with constant quiescent current, Idq, can have an output power that may change based on a variation of the supply voltage, Vdd. This is because, as known to a person skilled in the art, the output power, Pout, remains dependent on the supply voltage according to the equation:

$$Pout \sim ((Vdd - Vknee)^2)/(2*Rload),$$

so, as Vdd changes, the output power, Pout, also changes given that the load, Rload, is fixed. It follows that there is a desire to either eliminate or reduce variation of the output power, Pout, with respect to variation of the supply voltage.

In cases where a constant envelope radio frequency (RF) signal is desired to be amplified, output power to an amplifier can be provided by way of a low dropout (LDO) regulator whose pass device (or devices) conducts power to the amplifier. In cases where the amplifier, for example, a power amplifier, is a stacked amplifier comprising a plurality of series connected transistors, the pass device is coupled to a drain of an output transistor of the stacked amplifier, to provide a desired voltage at the drain commensurate with a desired output power of the stacked amplifier. Such scheme is used, for example, in a GSM (Global System for Mobile communication) amplifier (e.g. power amplifier), where an LDO regulator with a PMOS pass device coupled to the drain of the output transistor controls the output power of the amplifier. Since such GSM amplifier can draw in excess of 2 amps during a burst of the output power, the PMOS pass device must be sized for very low ON resistance to prevent the LDO regulator from saturating and causing an IR drop (i.e. voltage drop across the ON resistance) which would drop the output power and make the power control inaccurate. For this reason, the PMOS pass device is usually extremely large, which results in higher die size and cost. It follows that there is a desire to either eliminate or reduce the size of the LDO regulator.

SUMMARY

According to a first aspect of the present disclosure, a circuital arrangement is presented, the circuital arrangement comprising: a stack of a plurality of transistors arranged in a cascode configuration, comprising: (i) an input transistor adapted to receive an input radio frequency (RF) signal; and (ii) one or more cascoded transistors, the one or more cascoded transistors comprising an output transistor adapted to output, at an adjustable output power, an output RF signal based on the input RF signal, wherein: a supply voltage to the stack is a varying supply voltage, and a variation of the adjustable output power with respect to the varying supply voltage is compensated for by varying at least one gate voltage of the one or more cascoded transistors of the stack according to a variable voltage level of the varying supply voltage.

According to a second aspect of the present disclosure, a method for compensating a variation of an output power of an amplifier arrangement operating from a varying supply voltage is presented, the method comprising: providing a stack of a plurality of transistors arranged in a cascode configuration, comprising an input transistor and one or more cascoded transistors, the one or more cascoded transistors comprising an output transistor; supplying the varying supply voltage across the stack; providing gate voltages to the one or more cascoded transistors configured to provide a nominal output power at the output transistor; inputting a constant envelope radio frequency (RF) signal to the input transistor; based on the inputting, obtaining an amplified RF signal at the output transistor having an output power that varies with respect to the nominal output power as a function of the varying supply voltage; generating a compensation voltage that is a function of the varying supply voltage; combining the compensation voltage with at least one gate voltage of the gate voltages to the one or more cascoded transistors; and based on the combining, compensating a variation of the output power of the amplified RF signal so that the nominal output power is maintained.

The details of one or more embodiments of the invention are set forth in the accompanying drawings and the description below. Other features, objects, and advantages of the invention will be apparent from the description and drawings, and from the claims.

DESCRIPTION OF THE DRAWINGS

The accompanying drawings, which are incorporated into and constitute a part of this specification, illustrate one or more embodiments of the present disclosure and, together with the description of example embodiments, serve to explain the principles and implementations of the disclosure.

Like reference numbers and designations in the various drawings indicate like elements.

DETAILED DESCRIPTION

Figure 1:
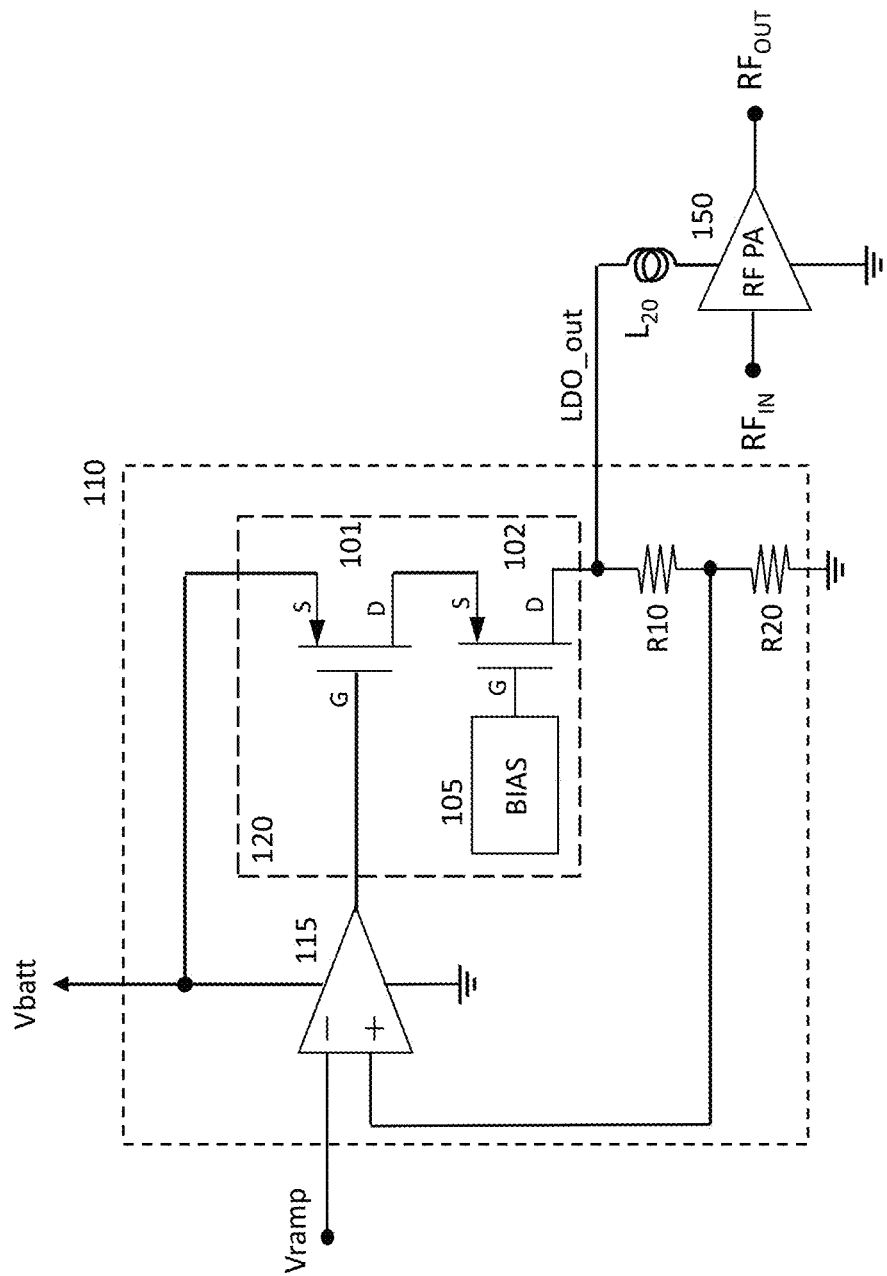
FIG. 1 is a simplified schematic representation of a prior art RF power amplifier whose output power is controlled by an LDO regulator. Power to the RF power amplifier is controlled by a control voltage, Vramp, input to a low power amplifier of the LDO regulator, where the LDO regulator outputs a power based on the Vramp control voltage and a supply voltage (Vbatt).

As shown in the simplified schematic representation of the prior art RF power amplifier (RF PA) of FIG. 1, an LDO regulator (110) can be used to control power to an RF power amplifier (150). The LDO regulator comprises a low power OpAmp (115) which drives a high current pass device (101) to provide power to the RF PA (150). If necessary, one or more additional second pass devices (102) can be used in a cascode configuration to allow for a larger voltage drop across the combination of the pass devices (101, 102), where the larger voltage drop can be substantially equal to the voltage of the supply Vbatt (e.g. nominal supply voltage of 3.5 volts for a handheld cell phone). A person skilled in the art would know that the pass devices can be in a cascoded configuration with a dedicated biasing circuit (105) for biasing the additional device. More information on such configuration and the controlling of the pass devices can be found, for example, in the above referenced U.S. patent application Ser. No. 15/415,768, and U.S. Pat. No. 9,857,818 whose disclosures are incorporated herein by reference in their entirety.

With further reference to FIG. 1, the RF PA (150) can be used to generate RF power in a GSM system, where the burst of GSM RF power is controlled by the LDO_out voltage that varies between a low voltage corresponding to, for example, essentially no power, and a high voltage that corresponds to maximum power. An output dynamic range of the RF power amplifier is thereby set via the LDO_out voltage, where the dynamic range may be different according to different applications (e.g. non-GSM applications with constant input RF envelope). Although the embodiments as described herein are exemplified by a power amplifier designed for a GSM application, a person skilled in the art can readily apply the inventive concepts as disclosed herein to other types of applications where it is desired to control amplification of a constant envelope signal.

With continued reference to FIG. 1, the LDO_out voltage that controls the RF power to the RF PA (150) is controlled by the Vramp control voltage fed to the inverting input of the OpAmp (115). In one exemplary embodiment, the Vramp is within a range of [0, 1.6] volts which corresponds to a scale factor of approximately 3.4/1.6 with respect to the LDO_out voltage for a case where the supply voltage Vbatt is 3.4 volts. Such scale factor can be provided by a scaling circuit comprising the resistors R1, R2 which divide the LDO_out voltage according to the scaling factor. Other scaling factors may be envisioned, depending on a design goal, using the same or a different scaling circuit. A person skilled in the art would know of many different design implementations of such scaling circuit to scale the LDO_out voltage using, for example, gain/attenuation and offset functions.

As known to a person skilled in the art, GSM transmission occurs in specific RF bursts that can be controlled by the Vramp signal input to the OpAmp (115). In order to provide conduction of a high current (e.g. 2 amps and beyond) during a high power phase of the RF bursts through the pass device(s) of the LDO, the pass device is designed with a very large size so as to provide a very low ON resistance ($R_{ON}$) to prevent a high voltage drop across the pass device and maximize efficiency of the RF PA (150) at maximum RF power. In one exemplary case, the pass device is a PMOS device with a gate width of 32 mm and occupies an area of 1 mm×0.4 mm. It follows that the various embodiments of the present disclosure can allow elimination of the LDO regulator, and therefore of the bulky pass device, and/or use an LDO regulator with a reduced size pass device.

Figure 2:
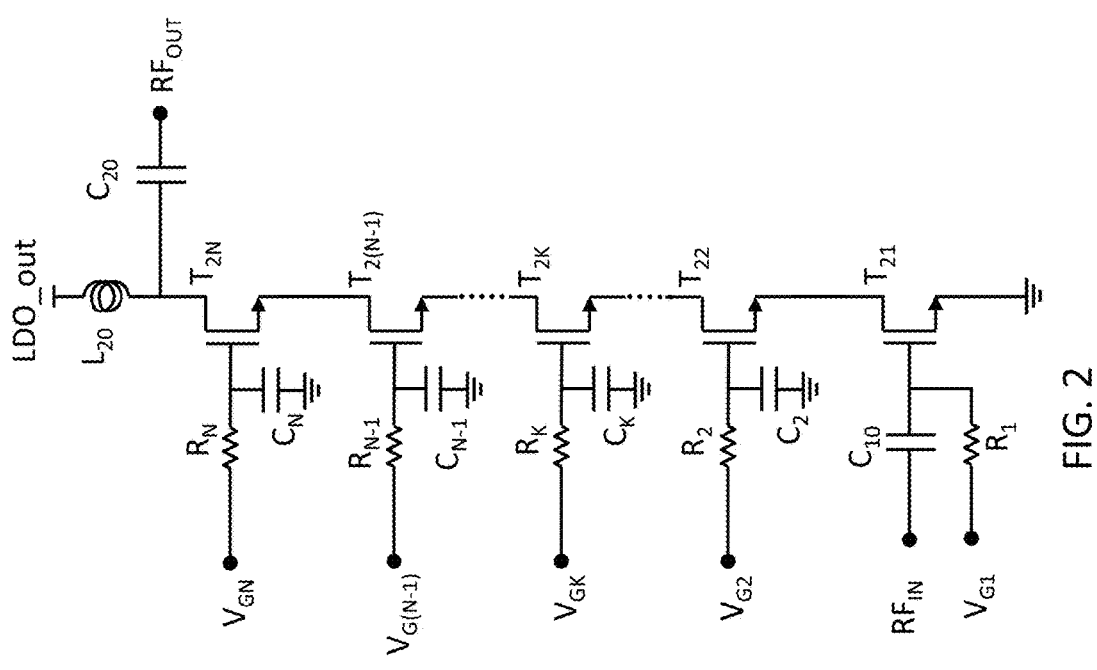
FIG. 2 shows a simplified schematic representation of a stacked amplifier (150) comprising a plurality of series connected transistors, including an input transistor (T21), an output transistor (T2N), and cascoded transistors (T22, . . . , T2N). Power to the stacked amplifier (150) is provided by way of an LDO regulator coupled to a drain of the output transistor (T2N). The stacked amplifier (150) can amplify a constant envelope input signal, $RF_{IN}$, and output an output signal, $RF_{OUT}$, whose power is controlled by the LDO regulator.

FIG. 2 shows a simplified schematic of a prior art stacked cascode (RF) amplifier (150) which can be used as the RF amplifier of FIG. 1. By way of example and not of limitation, the stacked cascode amplifier (150) can comprise a stack of FET transistors (T21, T22, ..., T2N) that are arranged in a cascoded configuration. An input RF signal, RFin, provided at a gate terminal of the input transistor T21 of the amplifier (150) is amplified by the amplifier (150) based on the voltage LDO_out provided to the drain of the output transistor (T2N). A corresponding amplified output RF signal, RFout, is provided at the drain of the output transistor, T2N, and routed to an output terminal of the amplifier through a coupling capacitor C20. Coupling capacitors C10 and C20 can be used to decouple low frequency (e.g., DC) biasing voltages provided to the stack of transistors (transistor stack) from the RFin and RFout signals. The supply voltage from the LDO regulator (e.g. 110 of FIG. 1), LDO_out, is provided to the drain of the output transistor, T2N, through an inductor, L20, and a reference voltage (e.g., GND) is connected to a source of the input transistor T21. Biasing voltages at nodes (VG2, VG3, ..., VGN) are provided to respective gates of the cascode transistors (T22, T23, ..., T2N) via series resistors (R2, R3, ..., RN). Biasing voltage to the input transistor, T21, can be provided at the node VG1. Various biasing circuits to generate such gate voltages to the RF amplifier (200) are described, for example, in the above referenced U.S. Pat. Nos. 9,219,445, 8,487,706 B2, to Published US Application No. 2014/0184335 A1, Published US Application No. US 2014/0184336 A1, Published US Application No. 2014/0184337 A1, and Published US Application No. 2015/0270806.

With further reference to the amplifier (150) depicted in FIG. 2, the biasing voltages at node (VG2, VG3, ..., VGN) are such that each transistor (T21, T22, ..., T2N) of the stack is biased according to a voltage compliance of the transistor. In other words, a voltage across any two terminals (e.g., gate, source, and drain) of the transistor is within a safe operating range of the transistor. As failure of transistor can be a statistical function of applied voltages across the transistors, even when such voltages are within the safe operating range, in some embodiments it may be desirable to subject the transistors of the stack to the same voltage ranges so as to provide an equal life expectancy (e.g., mean time before failure) for each transistor of the stack.

With further reference to the RF amplifier (150) of FIG. 2, according to an exemplary embodiment, the gate biasing voltages at nodes (VG2, VG3, ..., VGN) can be configured to evenly distribute the voltage across the transistor stack, LDO_out, amongst the stacked transistors (T21, T22, ..., T2N). In other words, a drain to source voltage, VDS, of each transistor (T21, T22, ..., T2N) of the stack is made to be substantially equal to a quarter (1/N) of the LDO_out voltage provided to the drain of the output transistor T2N. This can be done, for example in a case of a stack of four transistors (N=4), as described in the above referenced Published US Application No. 2015/0270806 A1, whose disclosure is incorporated herein by reference in its entirety, by biasing the gates of the transistors (T24, T23, T22) with respective biasing voltages at nodes (VG4, VG3, VG2) equal to LDO_out×3/4+VGS, LDO_out×2/4+VGS, and LDO_out×1/4+VGS, where VGS is a gate to source voltage of the cascoded transistors (T22, T23, T24). According to other exemplary embodiments, unequal distribution of the voltage LDO_out amongst the stacked transistors may be provided, while operating each of the transistors of the stack within its safe operating range.

A person skilled in the art would understand that during operation of the amplifier (150) of FIG. 2, an amplified RF signal at the drain of the output transistor T2N can be at a voltage level substantially higher than the supply voltage LDO_out. This means that if the gate voltage of the output transistor T2N, as provided by the node VGN, is maintained at a fixed voltage level, and therefore the source of T2N is maintained to a fixed voltage level (e.g., LDO_out×3/4+VGS for a case where N=4), then the drain to source voltage, VDS, of the output transistor T2N can be subjected to higher voltage excursions (including the RF signal), which can be beyond the tolerable voltage range of the transistor. Unequal voltage distribution of the voltage LDO_out by way of gate biasing voltages, as discussed above, may help to reduce stress exerted on the output transistor T2N due to unequal RF voltage distribution across the transistors of the stack, but may not be sufficient.

Based on the above, it can be desirable to control the stress on the individual transistors of the stack, due to unequal RF voltage division of the voltage at the drain of the output transistor T2N across the transistors (T21, T22, ..., T2N), which may subject any one of the transistors to a voltage beyond the tolerable voltage range of the transistor (e.g. close to or larger than its limit breakdown voltage). This can be accomplished by configuring the gates of the transistors (T22, T23, ..., T2N) of the stack to float via insertion of a gate capacitor (C2, C3, ..., CN) as depicted in FIG. 2. The value of the gate capacitor is chosen so to allow the gate voltage to vary along (float) with the RF signal at the drain of the corresponding transistor, which consequently allows control of the voltage drop (e.g., VDS) across the corresponding transistor, thus controlling the conduction of the transistor in accordance to the voltage at its drain, for a more efficient operation of the transistor. The (RF) voltage across the transistors (e.g. VDS) can therefore be equalized by choosing the correct combination of gate capacitor and gate bias voltage for each of the transistors. Teachings about this floating technique, also referred to as conduction controlling circuit, can be found in the above referenced U.S. Pat. No. 7,248,120, which is incorporated herein by reference in its entirety. According to some exemplary embodiments, the gate capacitors can provide substantially equal RF voltage division across the transistors of the stack.

A person skilled in the art would know that performance characteristic of the RF amplifier (150) depicted in FIG. 2 is mainly a function of a performance of the input transistor, T21. The input transistor T21 operates as a transconductor that translates an input voltage of the RFin signal to a current that conducts through the transistor stack (T21, T22, ..., T2N) and ultimately defines an RF voltage at the drain of the output device T2N. It is therefore desirable to have an input transistor of the stack with good output impedance (VDS/IDS). Furthermore, the person skilled in the art would understand that biasing of the cascoded transistors (T22, T23, ..., T2N) can be mainly be based on operation of such cascoded devices in their respective saturation regions of operation.

The embodiments as described herein are exemplified by an N-type MOSFET device, as shown in FIG. 2, used as a main conduction element of the RF amplifier (150). Such device can be part of a stack, where a plurality of such devices is connected in series so as to operate as a cascode, as shown in FIG. 2. A person of ordinary skill in the art will readily apply the inventive concepts as disclosed herein to other types of semiconductor devices, such as a P-type MOSFET device. The embodiments, according to the present invention, can also be applied to extended drain devices, such as laterally diffused metal oxide semiconductor (LDMOS) devices, and other gated transistors or devices. According to various embodiments of the present disclosure, such FET devices may include metal-oxide-semiconductor (MOS) field effect transistors (FETs), complementary metal-oxide-semiconductor (CMOS) FETs, and particularly to MOSFETs and CMOSFETs fabricated on silicon-on-insulator (SOI) and silicon-on-sapphire (SOS) substrates.

Figure 3:
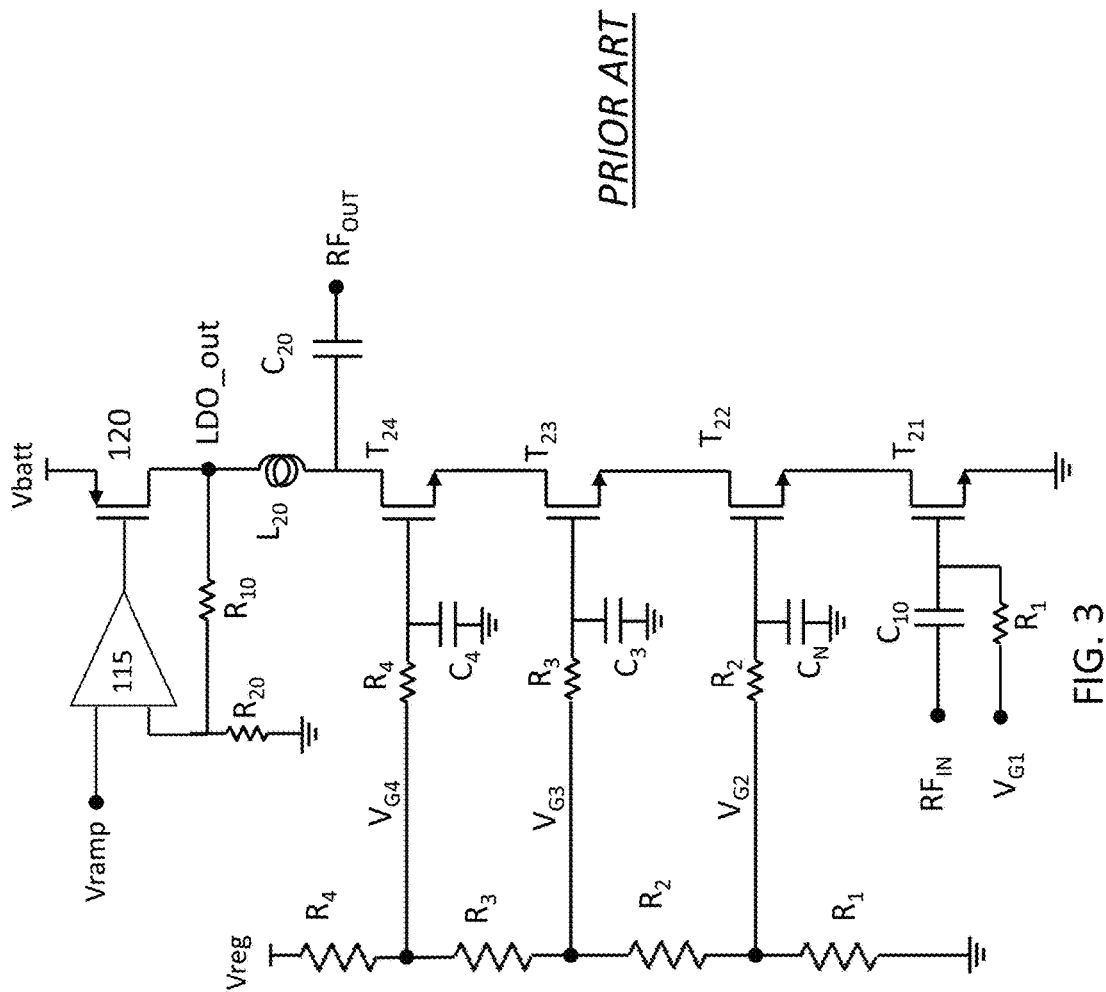
FIG. 3 shows a simplified schematic representation of a prior art RF power amplifier whose output power is controlled by an LDO regulator (115, 120) coupled to a drain of an output transistor (T24) of the RF power amplifier. The RF power amplifier depicted in FIG. 3 is a stacked amplifier comprising an input transistor (T21) and three cascoded transistors (T22, T23, T24) whose gates are biased with fixed voltages provided by a resistor tree.

A person skilled in the art readily knows that an SOI MOSFET device (e.g. T3, T4 of FIG. 1A, 1B) can be formed in a thin layer of silicon which overlies an insulating layer of an SOI substrate. Accordingly, and as known in the art, the SOI MOSFET device can be referred to as a thin-film SOI MOSFET, the thin-film referring to the thin layer of silicon. It should be noted that the various embodiments according to the present disclosure which will be described below can be implemented in thin-film SOI MOSFET devices. A more detailed description of such SOI MOSFET device can be found, for example, in the above referenced U.S. application Ser. No. 14/945,323, U.S. application Ser. No. 15/078,930, and U.S. Pat. No. 8,987,792 B2, whose disclosures are incorporated herein by reference in their entirety FIG. 3 shows a simplified schematic representation of a prior art RF power amplifier whose output power is controlled by an LDO regulator (115, 120) coupled to a drain of an output transistor (T24) of the RF power amplifier. The RF power amplifier depicted in FIG. 3 is a stacked amplifier comprising an input transistor (T21) and three stacked transistors (T22, T23, T24) whose gates are biased with fixed voltages provided by a resistor tree. A person skilled in the art would recognize that FIG. 3 represents the configuration depicted in FIG. 1 with the RF PA (150) of FIG. 2 for the exemplary case of a stack height of 4 (N=4). Gate biasing voltages to the cascoded transistors (T22, T23, T24) are provided by a resistor tree (R1, R2, R3, R4) coupled to a fixed voltage source Vreg. Such fixed voltage source may be obtained via a voltage regulator to provide a supply voltage that is independent from the supply voltage Vbatt that powers the LDO regulator (115, 120). As noted above, with reference to the RF amplifier depicted in FIG. 3, output power of the RFout signal is a function of the supply voltage at the drain of the output transistor T34, controlled by the LDO regulator, and the transconductance of the input transistor T21 controlled by the biasing of the input transistor via gate voltage VG1 and the gate voltage VG2 that together define the drain to source voltage VDS of T21.

Figure 4A:
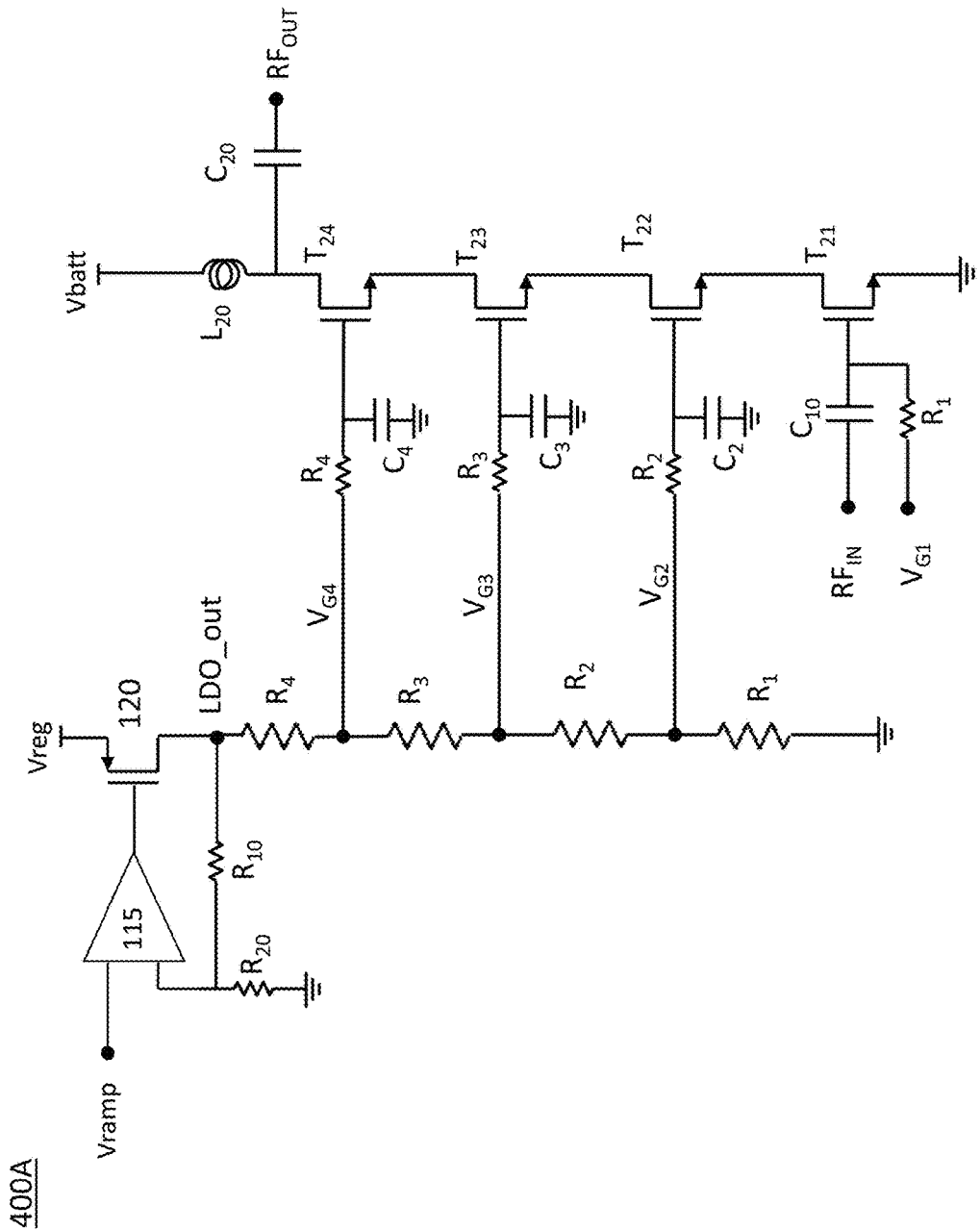
FIG. 4A is a simplified schematic representation of an RF power amplifier according to an exemplary embodiment of the present disclosure whose output power is controlled by varying voltages to gates of the cascoded transistors (T22, T23, T24) while maintaining the voltage at the drain of the output transistor (T24) (relatively) fixed by way of a supply voltage, Vbatt.

FIG. 4A is a simplified schematic representation of an RF power amplifier (400A) according to an exemplary embodiment of the present disclosure that can be used to amplify a constant envelope RFin signal (e.g. GSM signal) to obtain the RFout signal based on a constant supply voltage, Vbatt, coupled to the drain of the output transistor T34. Output power control of the RF power amplifier (400A) is provided by varying gate voltages (VG2, VG3, VG4) to the cascoded transistors (T22, T23, T24) via an LDO regulator (115, 120) whose output voltage, LDO_out, is coupled to a resistor tree (R1, R2, R3, R4). By varying the gate voltages of the cascoded transistors (T22, T23, T24) of the stack, operating bias points of the transistors (T21, T22, T23, T24) of the stack are changed to control output power of the RFout signal. Since the current through the resistor tree (R1, R2, R3, R4) can be orders of magnitude smaller than the current required through the transistor stack (e.g. 2 amps and above), the pass device (120) of the RF amplifier (400A) according to the present disclosure can be designed to be of substantially smaller size than that required in the prior art amplifier depicted in FIG. 3. As can be seen in FIG. 4, supply to the LDO regulator can be provided via a fixed voltage supply Vreg. Scaling of the LDO_out voltage with respect to the Vramp control voltage can be performed via scaling circuits similar to ones discussed above with respect to FIG. 1. Further design flexibility in scaling the gate voltages (VG2, VG3, VG4) can be provided via selection of the resistors (R1, R2, R3, R4).

With further reference to the RF amplifier (400A) according to the present disclosure, by varying the biasing points of the cascoded transistors (T22, T23, T24) through varying of the corresponding gate voltages, regions of the operation of the cascoded transistors can be made to switch from saturation to triode where the cascoded transistors operate as voltage controlled resistors thereby affecting (e.g. attenuating) the RFout signal. Also, by varying the gate voltage VG2 of T22, the drain voltage of the input transistor T21 is changed to effectively change transconductance of the input transistor T21, thereby affecting (e.g. gain/attenuation) the RFout signal. A person skilled in the art would understand that changing the drain voltage of the input transistor T21 while maintaining a fixed gate voltage, VG1, and a fixed source voltage (grounded) of the input transistor T21, changes biasing of the input transistor T21, and therefore changes its transconductance.

Figure 5A:
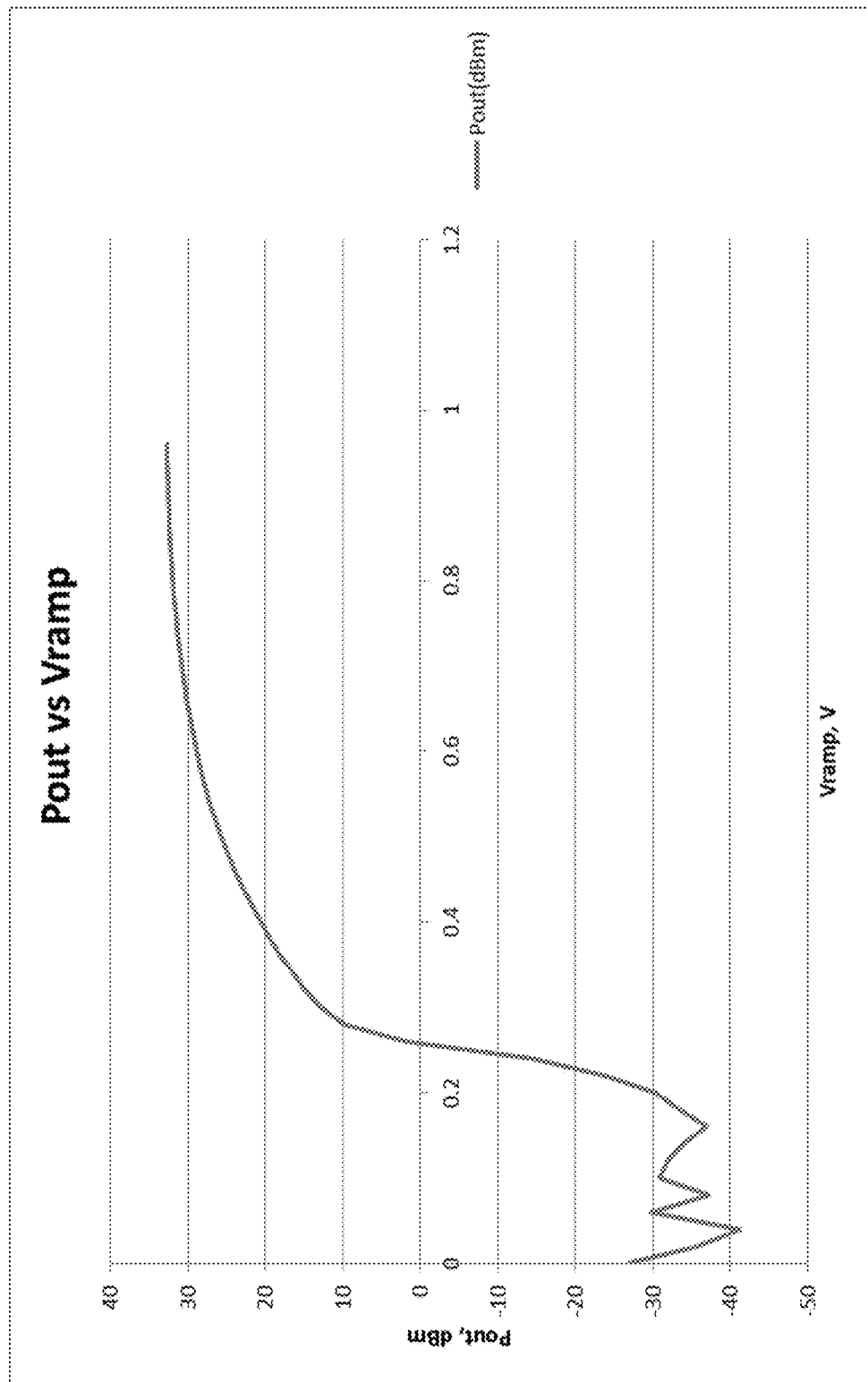
FIG. 5A is a graph representing an output power (dBm) versus an output power control voltage (Vramp) response of the RF power amplifier depicted in FIG. 4A. A dynamic range and linearity of such response is considered to be substantially equal to a response depicted in FIG. 5B of the prior art RF power amplifier of FIG. 3.
Figure 5B:
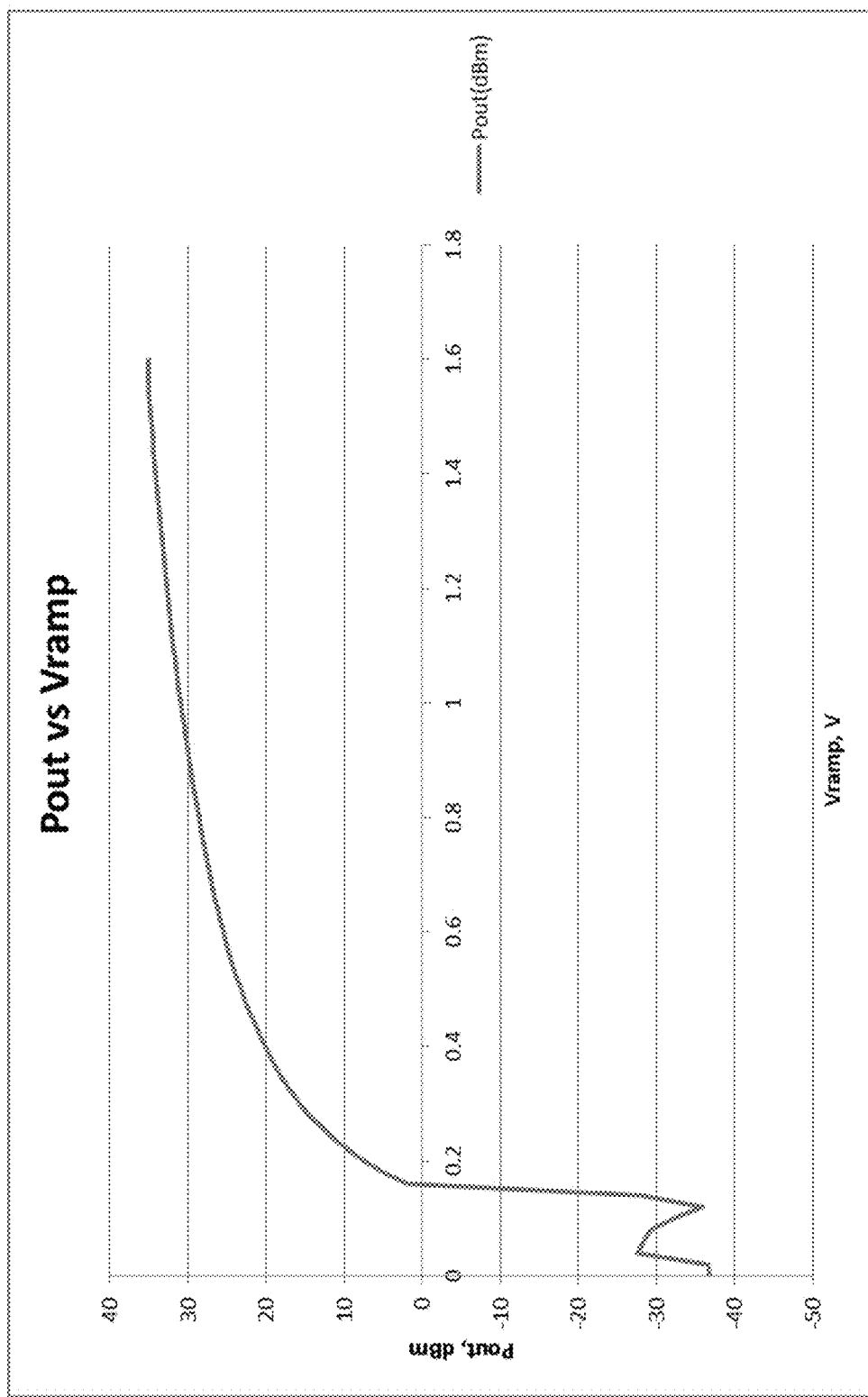
FIG. 5B is a graph representing an output power (dBm) versus an output power control voltage (Vramp) response of the prior art RF power amplifier depicted in FIG. 3.

FIGS. 5A and 5B show graphs representing respective output power (dBm) versus output power control voltage (Vramp) response of the RF power amplifier (400A) according to the present disclosure depicted in FIG. 4A and of the prior art RF power amplifier (300) depicted in FIG. 3. As can be seen in such graphs, a dynamic range, greater than 50 dBm (e.g. of about 60 dBm), and linearity of the response of the RF power amplifier (400A) is similar to a response of the prior art RF power amplifier depicted in FIG. 3, and therefore such power amplifier (400A) can be used in applications where the amplifier of FIG. 3 is used without noticeable degradation in performance, while providing the advantages of a smaller size pass device (120). Applicant of the present disclosure has also found that the linearity response may be further tweaked, if necessary, to match the linearity response of the RF power amplifier of FIG. 3 via, for example, a pre-distortion (e.g. conditioning, compensation) of the Vramp control voltage to the LDO regulator (115, 120) of the RF amplifier (400A). A person skilled in the art would know of many implementation examples to compensate for such linearity in the response.

With further reference to the RF power amplifier (400A), according to the present disclosure, depicted in FIG. 4A, a person skilled in the art would understand that by virtue of not regulating power to the stacked transistors (T21, ..., T24), in a manner similar to the configuration depicted in FIG. 3 where such regulation compensates for any variation of the supply voltage Vbatt, there may be a desire to further compensate any drift (i.e. variation) in the output power of the RF power amplifier (400A) based on the variation of the supply voltage, Vbatt. As the supply voltage, Vbatt, may be provided by a battery, such as a battery within a handheld device, a corresponding voltage level may vary within a range of, for example, 3.1 volts (fully drained) and 4.5 volts (connected to a charger). It follows that according a further embodiment of the present disclosure depicted in FIG. 4B, such drift in output power based on the variation of the supply voltage, Vbatt, may be compensated by adjustment of the Vramp voltage based on a voltage level of the supply voltage, Vbatt. Further exemplary embodiments of output power compensation circuits with respect to a varying supply voltage (e.g. Vbatt) are later described with reference to FIGS. 11-17.

Figure 4B:
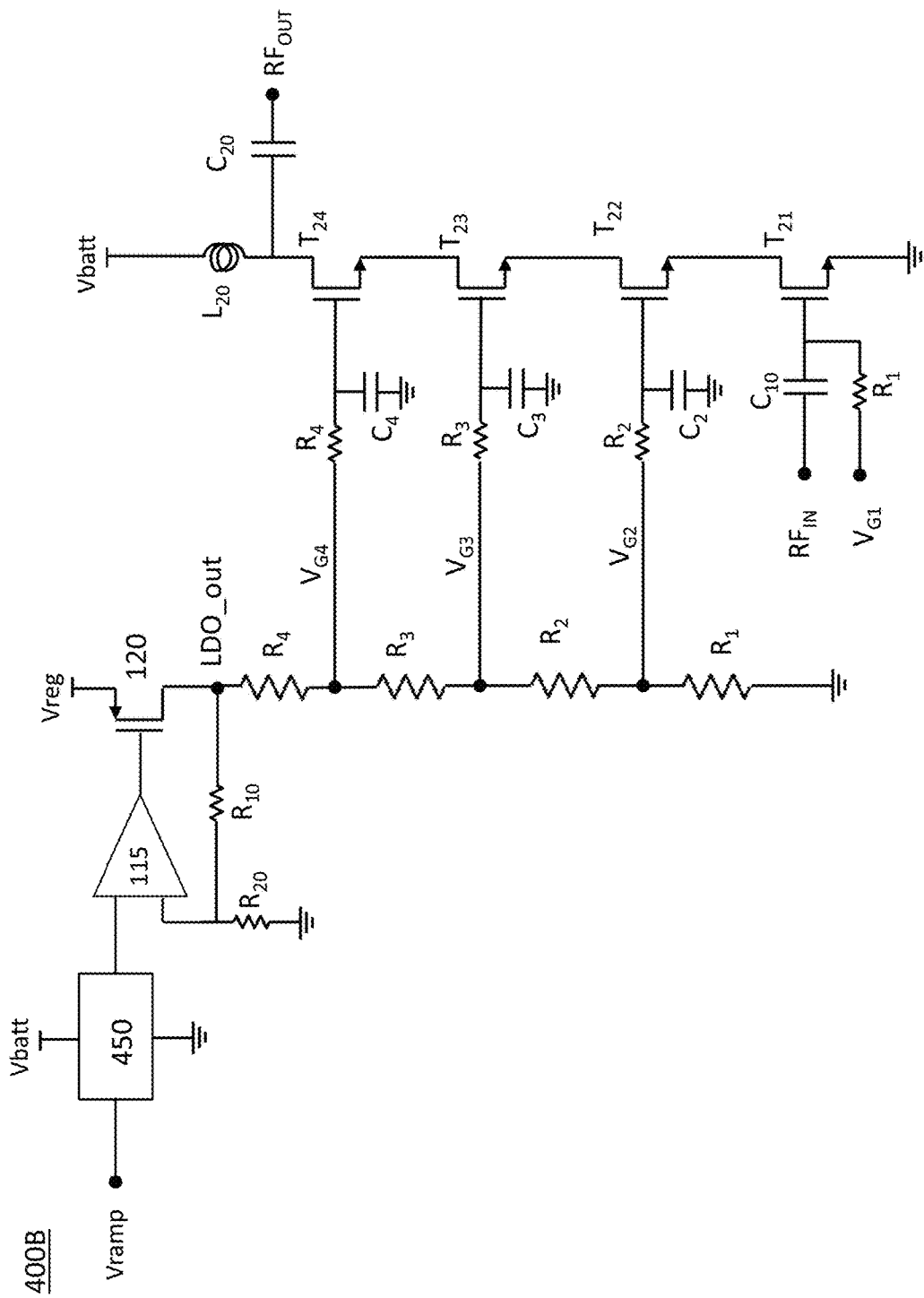
FIG. 4B is a simplified schematic representation of an RF power amplifier according to an exemplary embodiment of the present disclosure whose output power is controlled by varying voltages to gates of the cascoded transistors (T22, T23, T24) while maintaining the voltage at the drain of the output transistor (T24) (relatively) fixed by way of a supply voltage, Vbatt. A compensation circuit (450) is provided to adjust any drift in the voltage at the drain of the output transistor with respect to a varying supply voltage.

As can be seen in FIG. 4B, a compensation circuit (450) coupled to the supply voltage Vbatt, and therefore aware of a level of the supply voltage, Vbatt, can adjust an effective input control voltage to the operational amplifier (115) based on the Vramp control signal and the varying voltage level of the supply voltage, Vbatt. Same compensation circuit (450) may also be used to implement a pre-distortion of the Vramp control signal for linearity response purposes as discussed above. A person skilled in the art would know of many implementation examples of the compensation circuit (450) using digital and/or analog circuits, including memory circuit that may provide desired mapping and/or functions for generation of the effective input control voltage to the operational amplifier (115) based on voltages Vramp and/or Vbatt. Some exemplary implementations may seek compact design via analog only circuits, such as compensation circuits described below with reference to FIGS. 11-17. It should be noted that a variation of the supply voltage, Vbatt, may be according to a timescale that is many orders of magnitude larger than a timescale associated with a frequency, and an envelope, of an RF signal processed by the RF amplifier, and therefore, a voltage level of the supply voltage may be considered as substantially fixed during substantial periods of amplification. In other words, the compensation circuit may not need to be a "dynamic compensation" as described, for example, in the above referenced Published US Applications No. 2014/0184336 A1, 2014/0184335 A1, and 2014/0184337 A1, the disclosures of which are incorporated herein by reference in their entirety.

Figure 6:
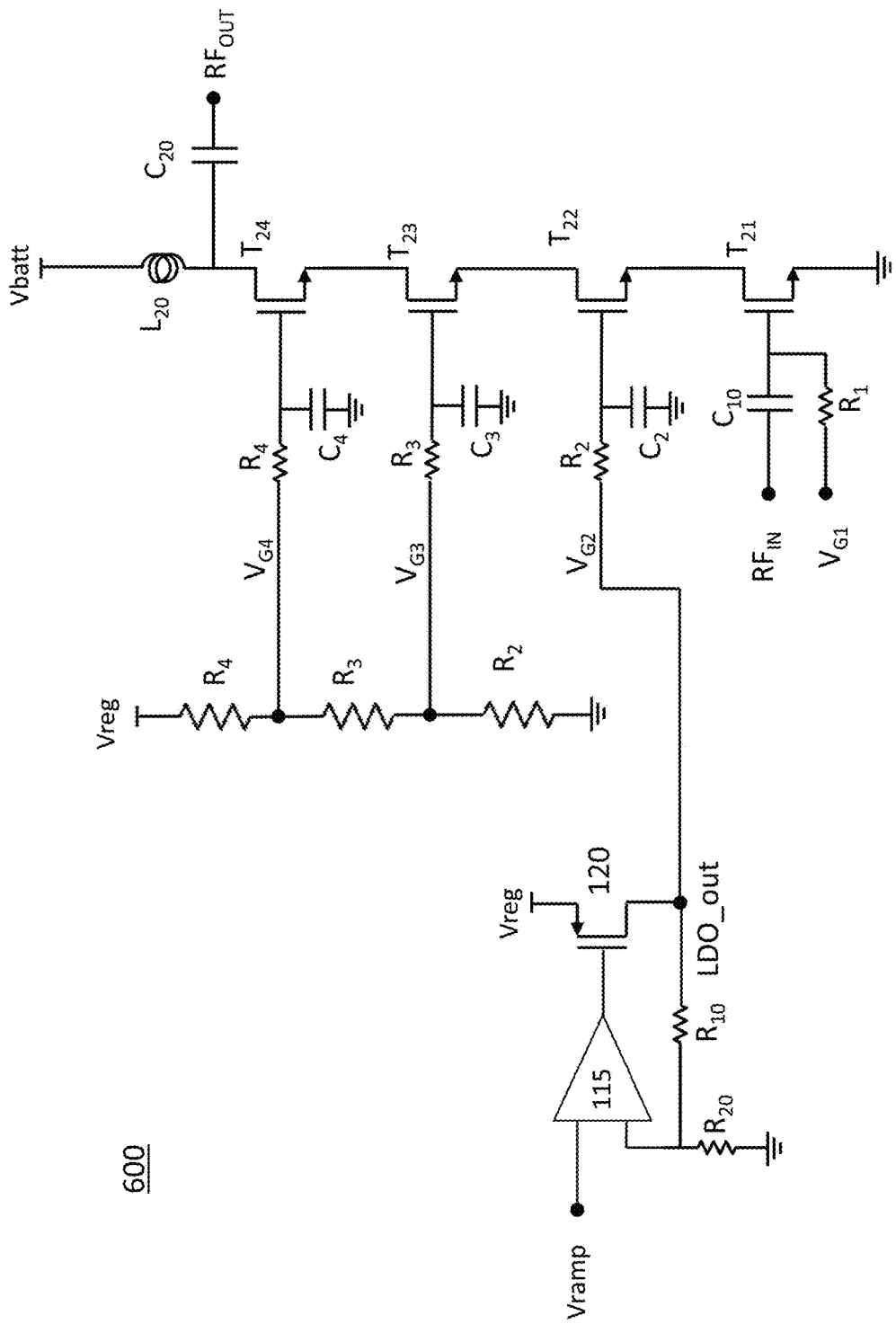
FIG. 6 is a simplified schematic representation of an RF power amplifier according to an exemplary embodiment of the present disclosure whose output power is controlled by varying a voltage to a gate of a single transistor (e.g. T22) of the cascoded transistors (T22, T23, T24) while maintaining the voltage at the drain of the output transistor (T24) (relatively) fixed and maintaining the gate voltages to the remaining cascoded transistors (T23, T24) fixed.

FIG. 6 is a simplified schematic representation of an RF power amplifier (600) according to an exemplary embodiment of the present disclosure whose output power is controlled by varying a voltage (e.g. VG2) to a gate of a single transistor (e.g. T22) of the cascoded transistors (T22, T23, T24) while maintaining the voltage at the drain of the output transistor T24 fixed and maintaining the gate voltages (VG3, VG4) to the remaining cascoded transistors (T23, T24) fixed. The RF power amplifier (600) according to the present disclosure may be considered a special case of the configuration (400A) of FIG. 4A, where instead of varying gate voltages to all the cascoded device (T22, T23, T24) only the gate voltage VG2 to the cascoded transistor (T22), in series connection to the input transistor T21, is varied. Accordingly, and as described above with reference to the RF amplifier (400A) of FIG. 4A, transconductance of the input transistor is varied so as to affect power of the RFout signal based on the Vramp control voltage to the regulator (115, 120). It should be noted that although a same supply voltage Vreg is shown in FIG. 6 to provide power to the LDO regulator and the resistor tree (R2, R3, R4), different fixed supplies may also be used.

Figure 7:
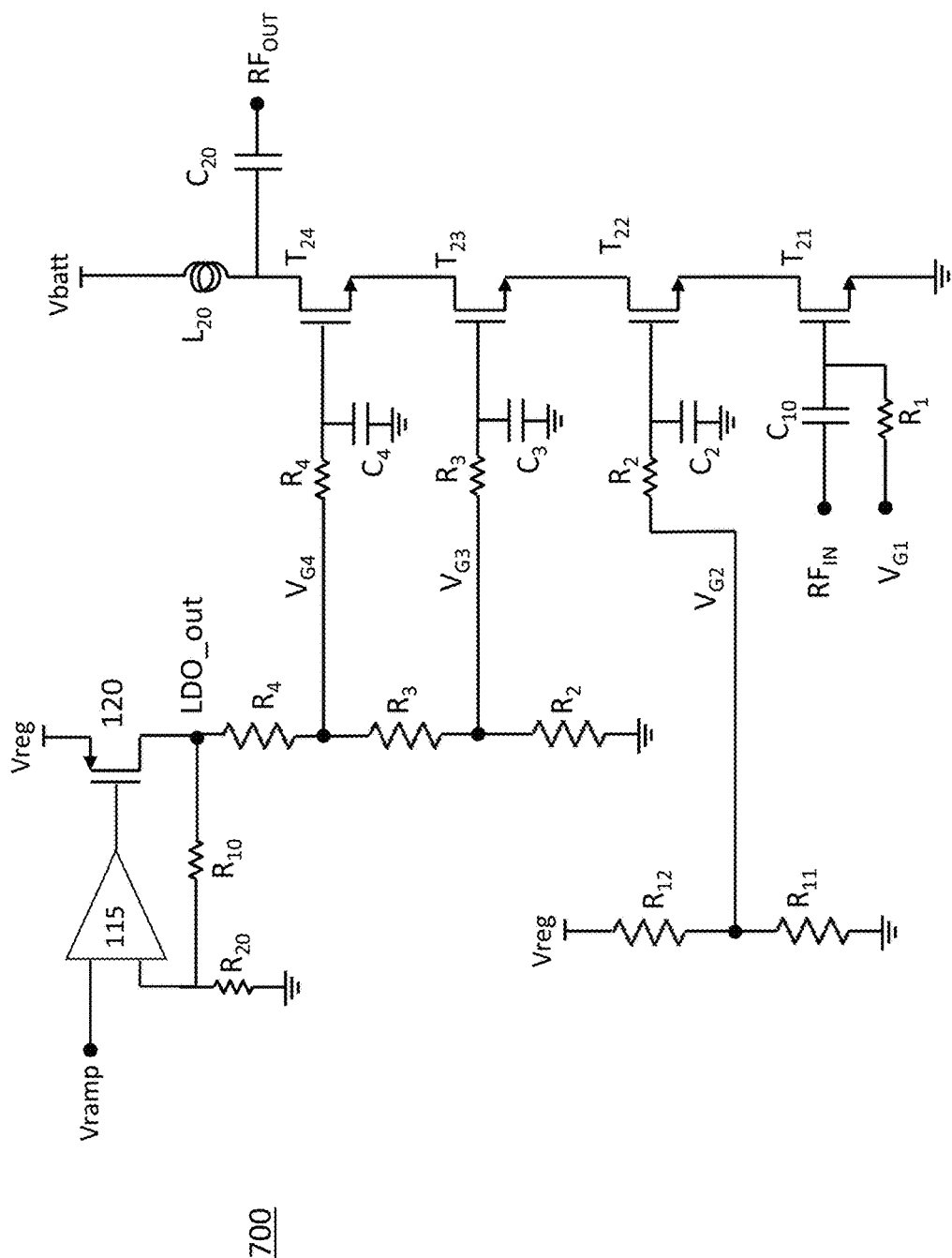
FIG. 7 is a simplified schematic representation of an RF power amplifier according to an exemplary embodiment of the present disclosure whose output power is controlled by varying a voltage to gates of a plurality of transistors (e.g. T23, T24) of the cascoded transistors (T22, T23, T24) while maintaining the voltage at the drain of the output transistor (T24) (relatively) fixed and maintaining the gate voltages to the remaining cascoded transistors (T22) fixed.

FIG. 7 depicts yet another exemplary implementation of the RF amplifier (400A) according to the present disclosure, where output power of an RF amplifier (700) is controlled by varying a voltage to the gates (VG3, VG4) of a plurality of transistors (e.g. T23, T24) of the cascoded transistors (T22, T23, T24) while maintaining the voltage at the drain of the output transistor T24 fixed (Vbatt) and maintaining the gate voltages (VG2) to the remaining cascoded transistors (T22) fixed. As noted above, by varying gate voltages of the upper cascoded transistors (T23, T24), operation of such transistors can be controlled to shift from saturation to the triode region and therefore cause attenuation of the RFout signal. Since VG2 is kept constant via the resistor tree (R11, R12), the operating bias point of the input transistor T21, and therefore its transconductance, is maintained substantially constant.

Figure 8:
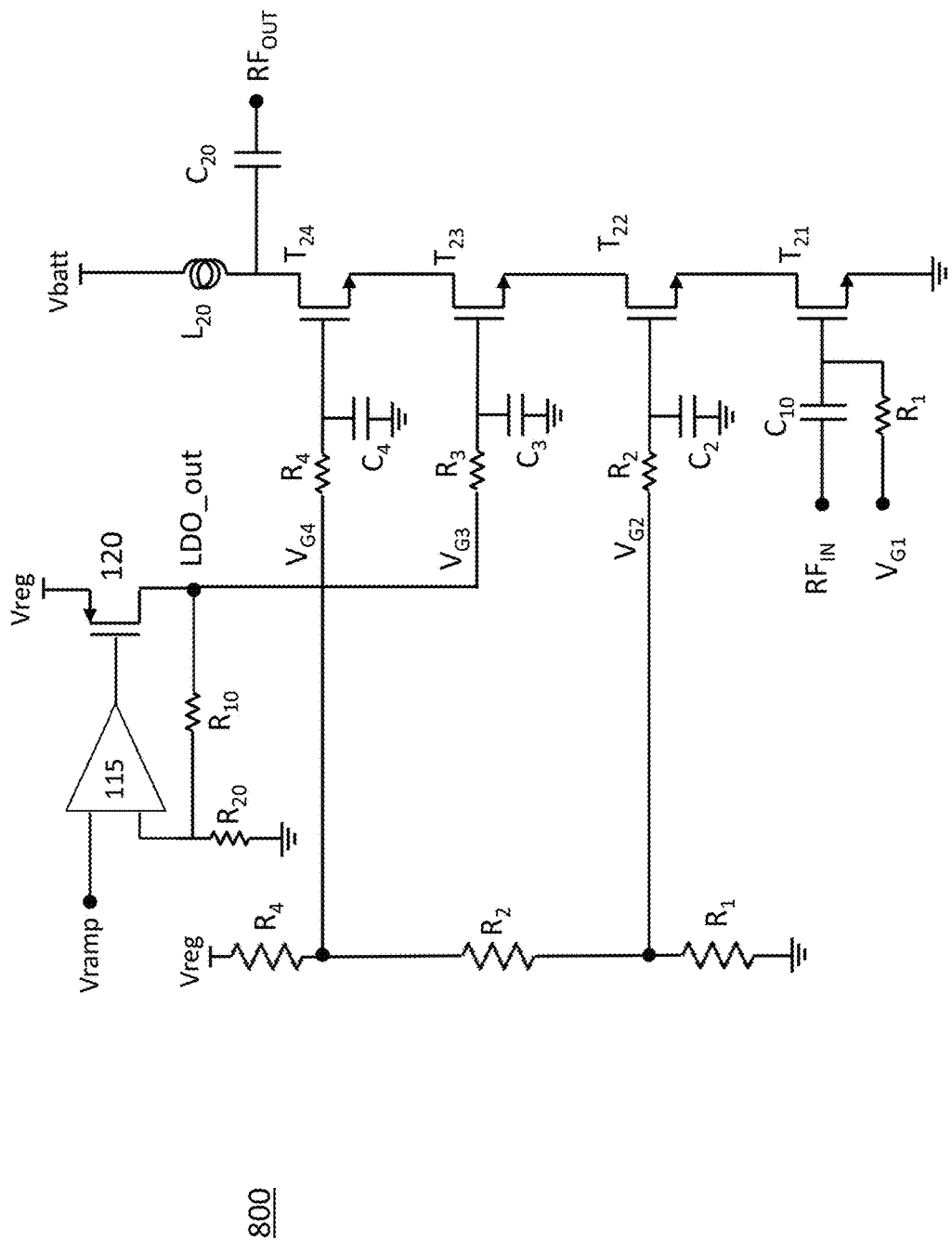
FIG. 8 is a simplified schematic representation of an RF power amplifier according to an exemplary embodiment of the present disclosure whose output power is controlled by varying a voltage to a gate of a transistor (e.g. T23) of the cascoded transistors (T22, T23, T24) while maintaining the voltage at the drain of the output transistor (T24) (relatively) fixed, by way of a supply voltage Vbatt, and maintaining the gate voltages to the remaining cascoded transistors (T22, T24) fixed. A person skilled in the art would understand that the various embodiments according to the present disclosure allow varying one or more gate voltages of the cascoded transistors (T22, T23, T24) to control output power of the amplifier while maintaining the gate voltages to the remaining cascoded transistors fixed, as well as maintaining the voltage at the drain of the output transistor to a relatively fixed level as provided by, for example, a battery of a handheld device.

FIG. 8 is a simplified schematic representation of an RF power amplifier (800) according to an exemplary embodiment of the present disclosure whose output power is controlled by varying a voltage VG3 to a gate of a transistor (e.g. T23) of the cascoded transistors (T22, T23, T24) while maintaining the voltage at the drain of the output transistor T24 fixed and maintaining the gate voltages (VG2, VG4) to the remaining cascoded transistors (T22, T24) fixed. As described above with respect to the configurations (400A, 600, 700), varying the gate voltage VG4 of the output transistor T24 can cause an attenuation of the RFout signal under control of the LDO_out voltage, while varying the gate voltage VG2 of the cascoded transistor T22 coupled to the input transistor T21 can cause change in the transconductance of the input transistor T21 for a corresponding change in the gain of the transistor stack (T21, T22, T23, T24). The configuration (800) of FIG. 8 may therefore provide, for example, for a same scaled LDO_out voltage range, a lager dynamic control of the output RF power when compared to the configuration (700), and a larger attenuation of the RF output power when compared to the configuration (600) of FIG. 6. Based on the teachings of the present disclosure, a person skilled in the art would know how to optimize a power control of an RF power amplifier in view of specific design goals than may include a required dynamic range of the power control.

The various embodiments according to the present disclosure allow varying one or more gate voltages of the cascoded transistors (T22, T23, T24) to control output power of the amplifier while maintaining the gate voltages to the remaining cascoded transistors fixed, as well as maintaining the voltage at the drain of the output transistor T24 to a relatively fixed level as provided by, for example, a battery of a handheld device. Although concept of such power control has been described by way of an LDO regulator whose input control voltage, Vramp, is scaled according to a power control design goal, to provide an LDO_out voltage used to generate corresponding gate voltages to the cascoded transistors of the stack, other implementations for generating such gate voltages may be provided, as shown in FIG. 9 and FIG. 10.

Figure 9:
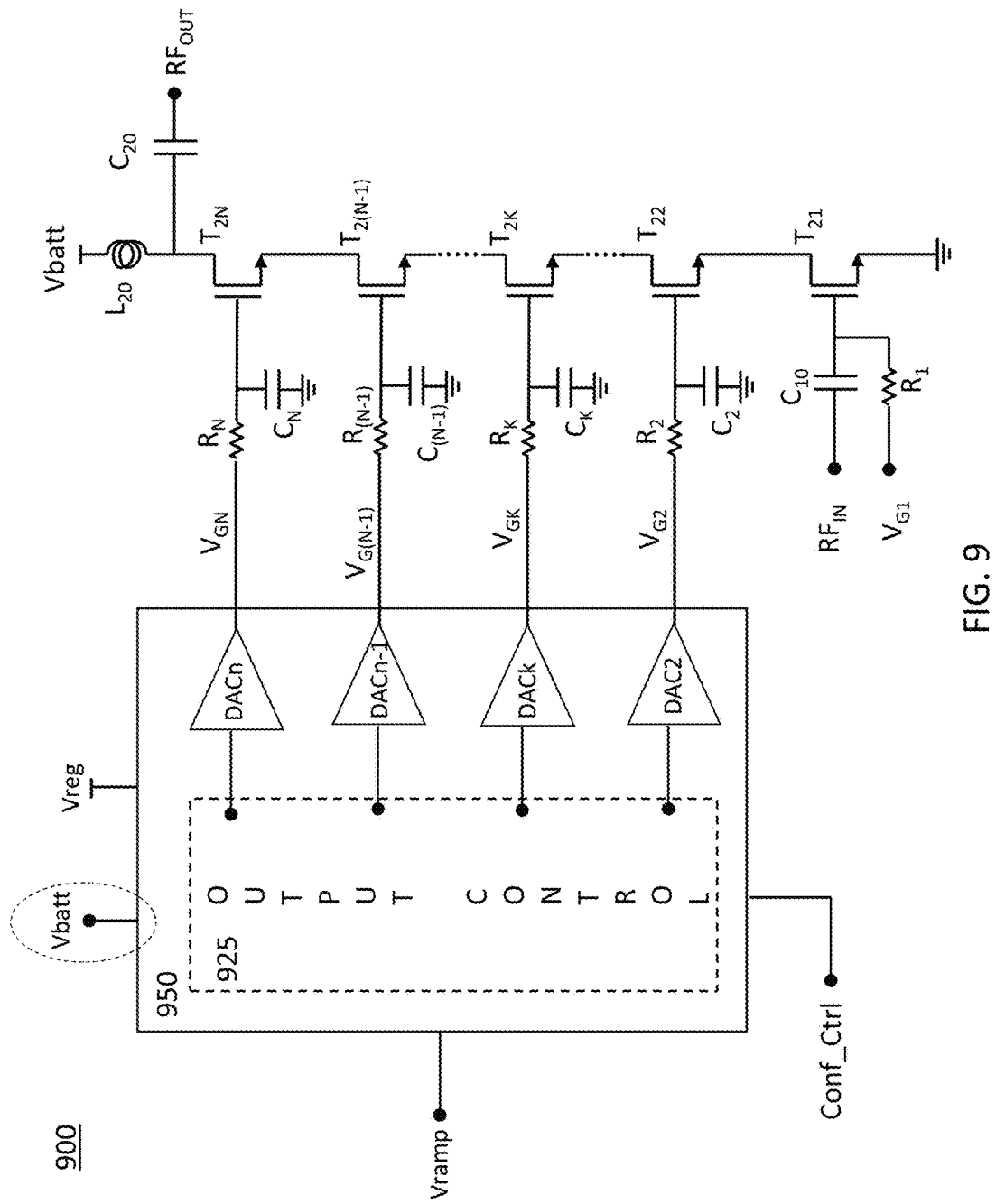
FIG. 9 is a simplified schematic representation of an RF power amplifier according to an exemplary embodiment of the present disclosure whose output power is controlled by varying one or more gate voltages of the cascoded transistors (T22, T23, . . . , T2N) while maintaining the voltage at the drain of the output transistor (T2N) (relatively) fixed and maintaining the gate voltages to the remaining cascoded transistors fixed. Varying or fixing the gate voltages may be performed by a multichannel (DAC1, DAC2, . . . , DACn) digital-to-analog converter (950) or by any other voltage control means known to a person skilled in the art.
Figure 10:
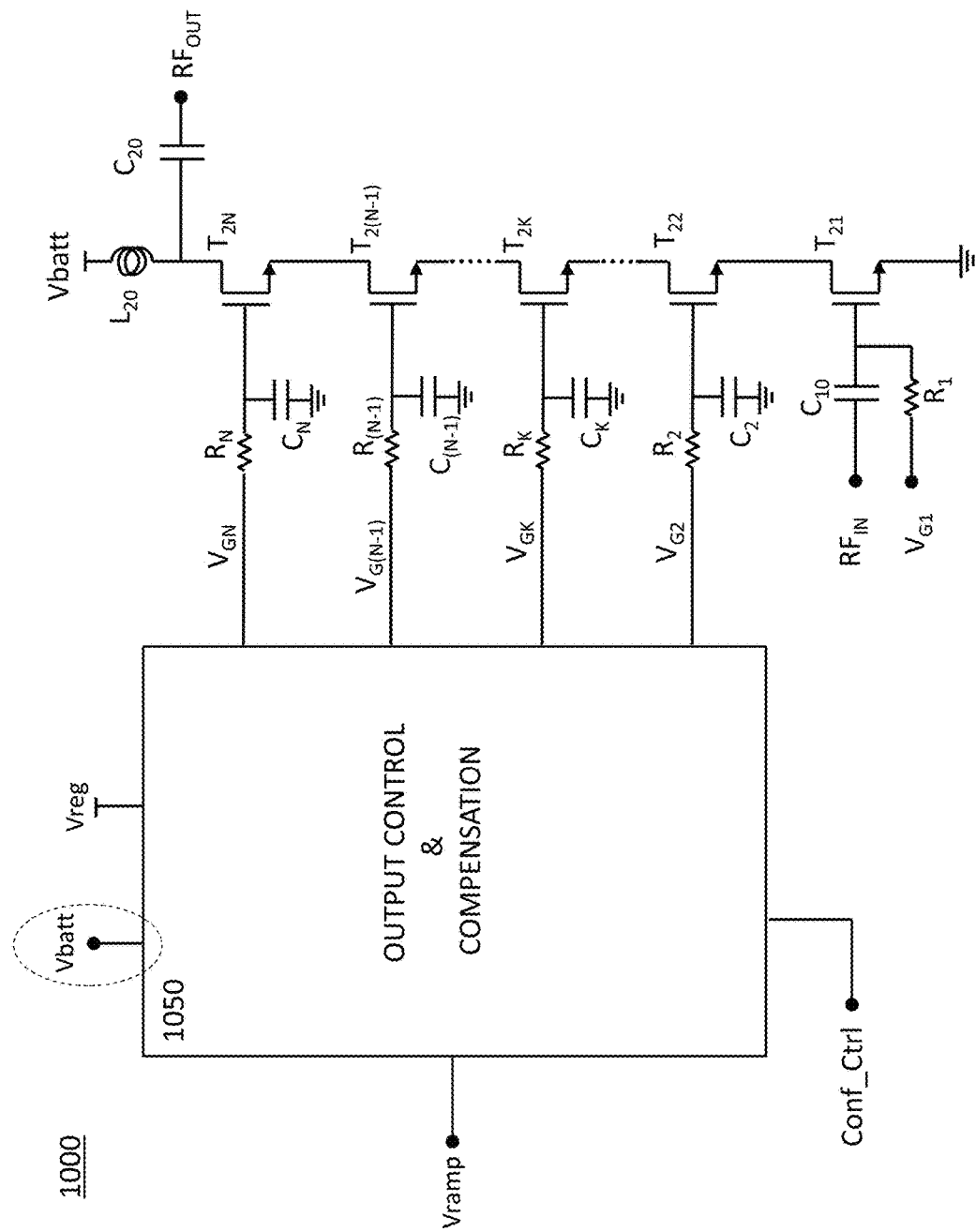
FIG. 10 is a simplified schematic representation of an RF power amplifier according to an exemplary embodiment of the present disclosure whose output power is controlled by varying one or more gate voltages of the cascoded transistors (T22, T23, ..., T2N) while maintaining the voltage at the drain of the output transistor (T2N) (relatively) fixed and maintaining the gate voltages to the remaining cascoded transistors fixed. Varying or fixing the gate voltages may be performed by an output control & compensation module comprising analog and/or digital circuits.

FIG. 9 is a simplified schematic representation of an RF power amplifier (900) according to an exemplary embodiment of the present disclosure whose output power is controlled by varying one or more of the gate voltages (VG2, VG3, . . . , VGN) of the cascoded transistors (T22, T23, . . . , T2N) while maintaining the voltage at the drain of the output transistor (T2N) fixed and maintaining the gate voltages to remaining cascoded transistors fixed. Varying or fixing the gate voltages (VG2, VG3, . . . , VGN) may be performed by a multichannel (DAC1, DAC2, . . . , DACn) digital-to-analog converter (950) or by any other voltage control means known to a person skilled in the art. Performance of the RF amplifier (900), as measured, for example by a dynamic range and linearity response curve similar to one depicted in FIGS. 5A and 5B, may be controlled via a configuration control signal, Conf_Ctrl, provided to an output control module (925) of the DAC (950). Accordingly, any compensation for linearity and/or fixing/varying of the various gate voltages (VG2, VG3, . . . , VGN) for obtaining a desired gain/attenuation performance of the RF amplifier (900) can be controlled via the configuration control signal provided to the output control module (925). A person skilled in the art would know of many implementations of a compensation circuit that may include analog, digital or combination of analog and digital circuits. Furthermore, if desired, the supply voltage Vbatt may optionally be provided to the output control module (925) for provision of functionality equivalent to the one provided by the compensation circuit (450) discussed above with reference to FIG. 4B, or later discussed with reference to FIGS. 11-17.

With further reference to FIG. 9, according to one exemplary embodiment of the present disclosure, a lookup table (e.g. storing configuration control data) may reside within the output control module (925) that maps the Conf_Ctrl signal to a desired performance of the RF amplifier (900) amongst one or more performance profiles stored in the lookup table. According to another exemplary embodiment of the present disclosure, the output control module (925) may include storage means that can be updated on the fly to dynamically control performance of the RF amplifier (900).

As described above, voltage to the gates of the cascoded transistors may be provided by way of analog circuits, such as described with reference to FIGS. 4A, 4B, 6-9, or by way of digital/analog circuits, such as described with reference to FIG. 9. A person skilled in the art would be able to use the present teaching to derive a variety of analog and/or circuits that can be used to control the output power provided at the drain of the output transistor T2N by varying one or more of the gate voltages (VG2, ..., VGN) while maintaining the remaining gate voltages (VG2, ..., VGN) fixed, as shown in FIG. 10. The output control & compensation module (1050) of FIG. 10 can provide similar functionality as provided by the module (950) of FIG. 9 and the gate biasing circuits provided in FIGS. 4A, 4B, 6-9. Optional compensation function (e.g. with respect to variation of the supply voltage Vbatt) may also be provided by the output control & compensation module (1050) of FIG. 10. According to some exemplary embodiments, the compensation function may be present at all time and selectively enabled and disabled.

Figure 11:
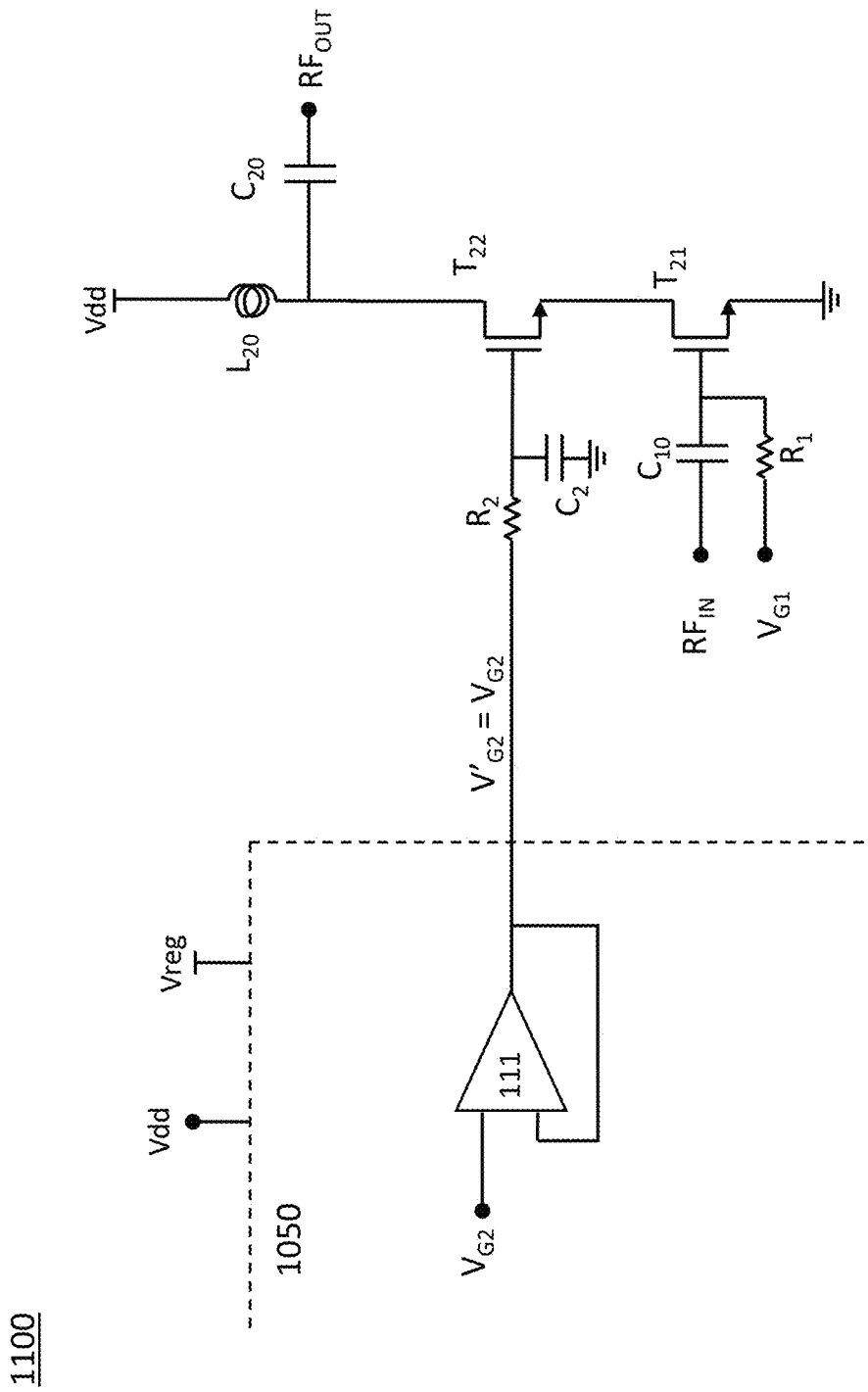
FIG. 11 is simplified schematic representation of an RF power amplifier according to an exemplary embodiment of the present disclosure whose output power is controlled by varying a gate voltage.

FIG. 11 is simplified schematic representation of an RF power amplifier (1100), according to an exemplary embodiment of the present disclosure, whose output power is controlled by varying a gate voltage, VG2, of a cascode transistor T22 of stacked transistors (T21, T22) operating as an amplifier. The RF power amplifier (1100) of FIG. 11 represents an exemplary configuration based on the configuration depicted in FIG. 10, where a buffer circuit (111) is used to provide a gate voltage, VG2, to control an output power of the stacked transistors (T21, T22) used in the amplifier. According to an exemplary embodiment, and as shown in FIG. 11, the buffer circuit (111) may be part of the output control & compensation module (1050). As discussed above, the supply voltage, Vdd, to the cascoded transistors (T21, T22), may be a varying supply voltage (e.g. battery), such as the Vbatt supply discussed with reference to the above figures. As discussed above, and shown, for example, in FIG. 13B later described, the stack of cascoded transistors may be of a higher size, and therefore may include more than the two transistors (T21, T22) shown in FIG. 11. Also, as discussed above, and shown, for example, in FIG. 13B later described, the output power controlling gate voltage (e.g. VG2) may be provided to one or more of the cascode transistors, and not only to the output transistor of the stack (e.g. T22).

With further reference to FIG. 11, in a case where the supply voltage, Vdd, varies and no compensation of such supply voltage variation is provided by way of the gate voltage, VG2, then the output power, Pout, of the RF amplifier (1100) of FIG. 11, can vary according to the well-known equation:

$$Pout=((Vdd-Vknee)^2)/(2*Rload),$$

where Rload represents a load coupled to the output of the RF amplifier (1100), and Vknee represents the knee voltage of the I-V characteristic curve of the input transistor T21 of the cascoded transistors (T21, T22).

Figure 12A:
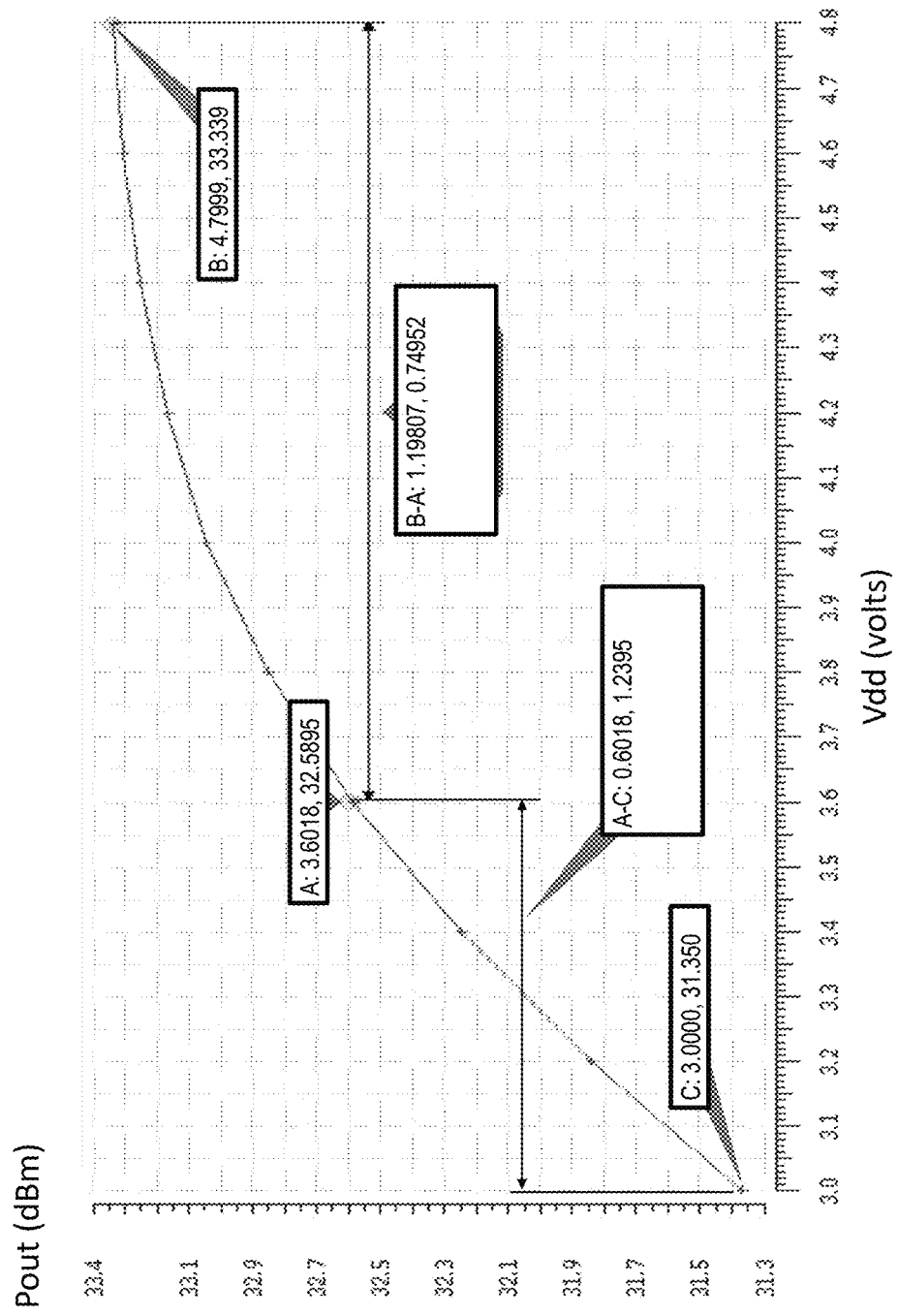
FIG. 12A is a graph representing a simulated output power of the amplifier of FIG. 11 as a function of a varying supply voltage to the amplifier.

FIG. 12A is a graph representing a simulated output power of the RF amplifier (1100) of FIG. 11 as a function of a varying supply voltage, Vdd, to the amplifier, while the gate voltage, VG2, is set to a constant voltage value. In the exemplary case represented by point A in the graph of FIG. 12A, the gate voltage VG2 is set to 0.74 volts so to set the output power to 32.6 dBm for a supply voltage of 3.6 volts. The graph is obtained by sweeping the supply voltage, Vdd, from 3.0 volts (point C) to 4.8 volts (point B), to obtain a variation of the output power, Pout, of about 2 dB while maintaining the gate voltage constant. In particular, as can be seen from the plot, between points A and B, the output power, Pout, increases by 0.75 dB as Vdd increases from 3.6 volts to 4.8 volts, and between points A and C, the output power, Pout, drops by 1.3 dB as Vdd decreases from 3.6 volts to 3.0 volts. A person skilled in the art would realize that such variation of the output power, Pout, with respect to the varying supply voltage, such as, for example, a battery, may not be desired in some applications where, for example, precise limits of the output power may be required and/or governed by local regulations.

Figure 12B:
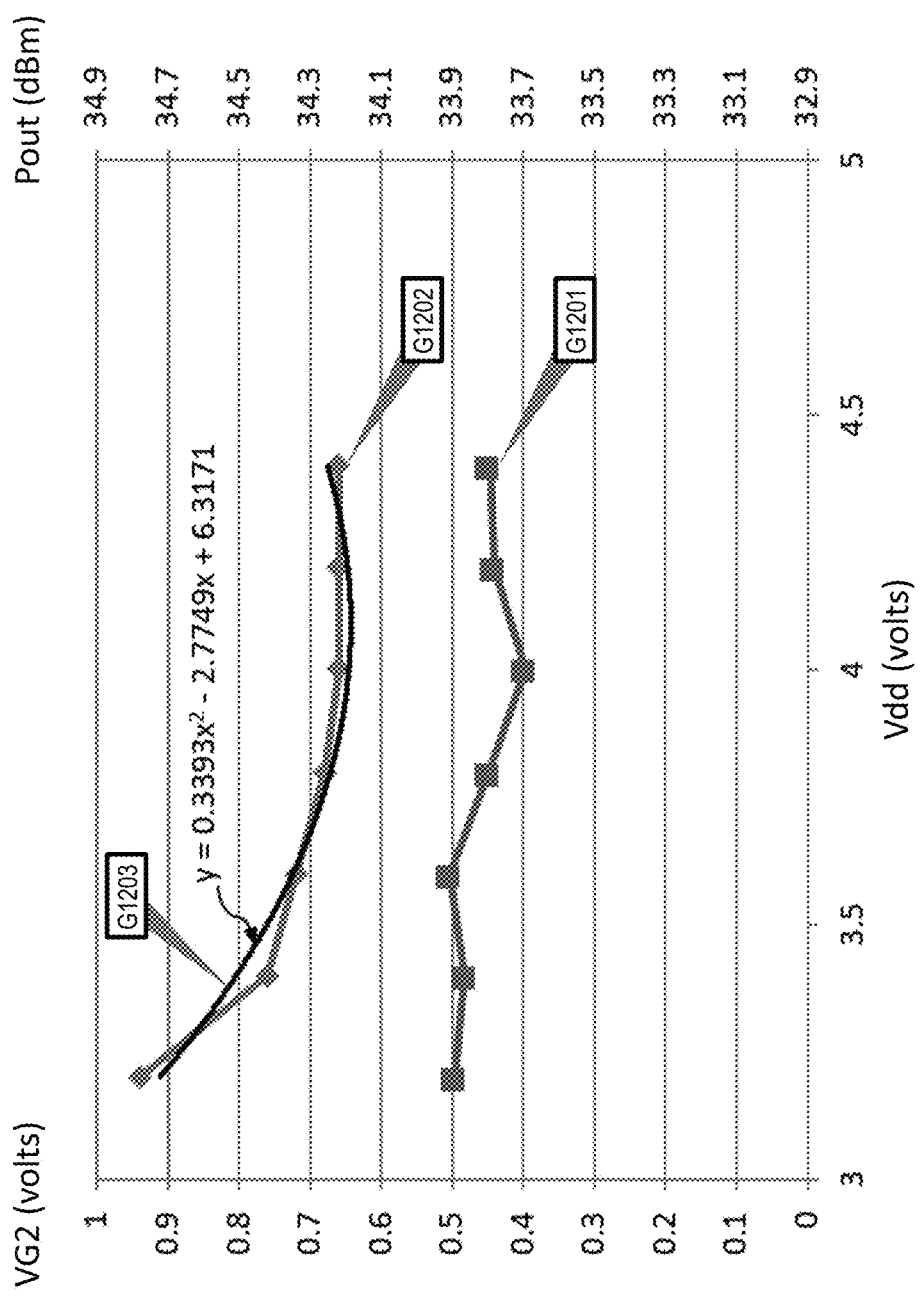
FIG. 12B are graphs representing output power compensation of the amplifier of FIG. 11 with respect to the varying supply voltage to the amplifier shown in FIG. 12A. A first graph shows the compensated output power, a second graph shows the gate voltage that provides the compensated output power, and a third graph shows a second order polynomial curve that fits the second graph.
Figure 13A:
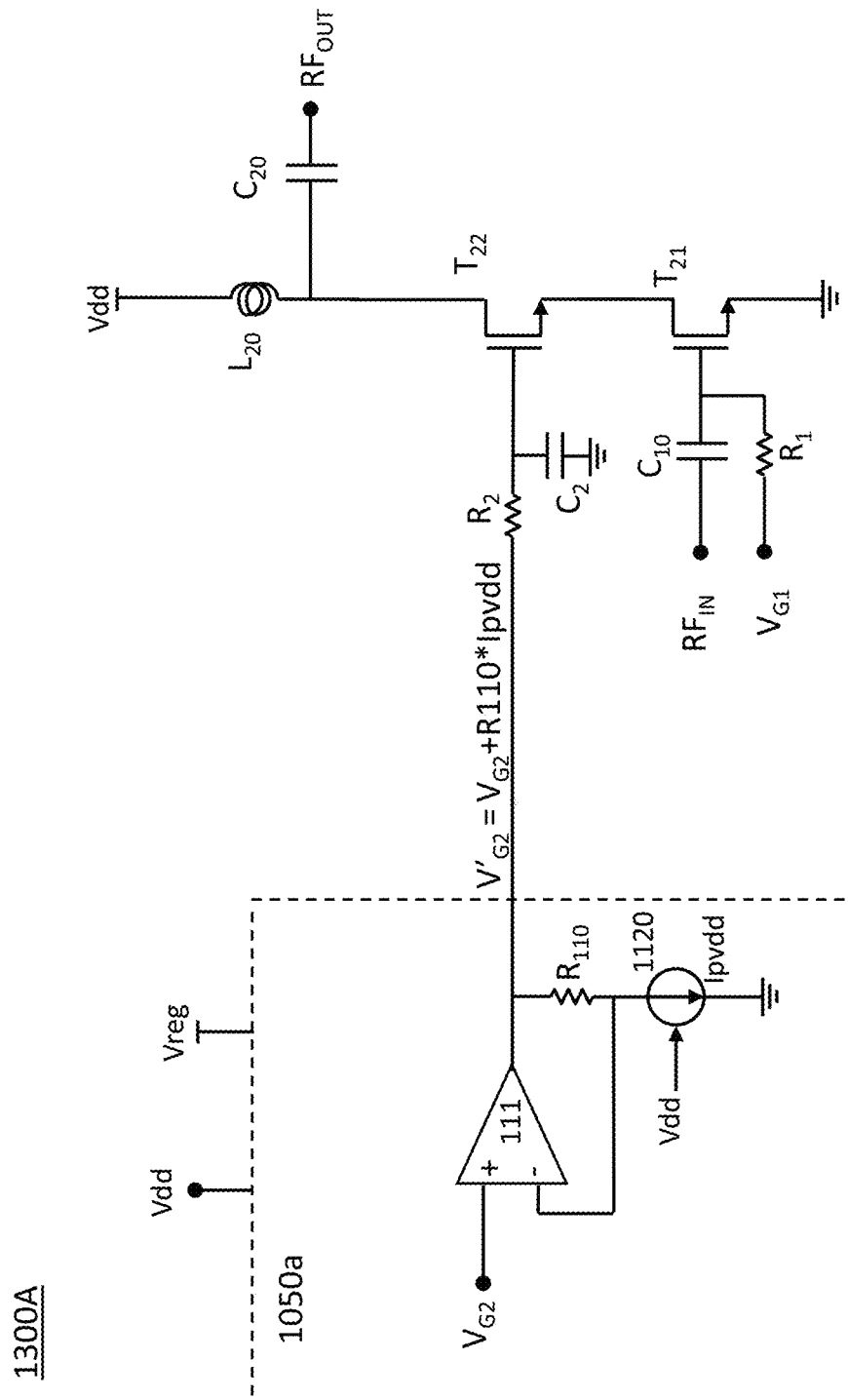
FIG. 13A is a simplified schematic representation according to an exemplary embodiment of the present disclosure of an RF power amplifier with a current based compensation circuit that can be used to compensate the output power of the amplifier with respect to a varying supply voltage to the amplifier.
Figure 13B:
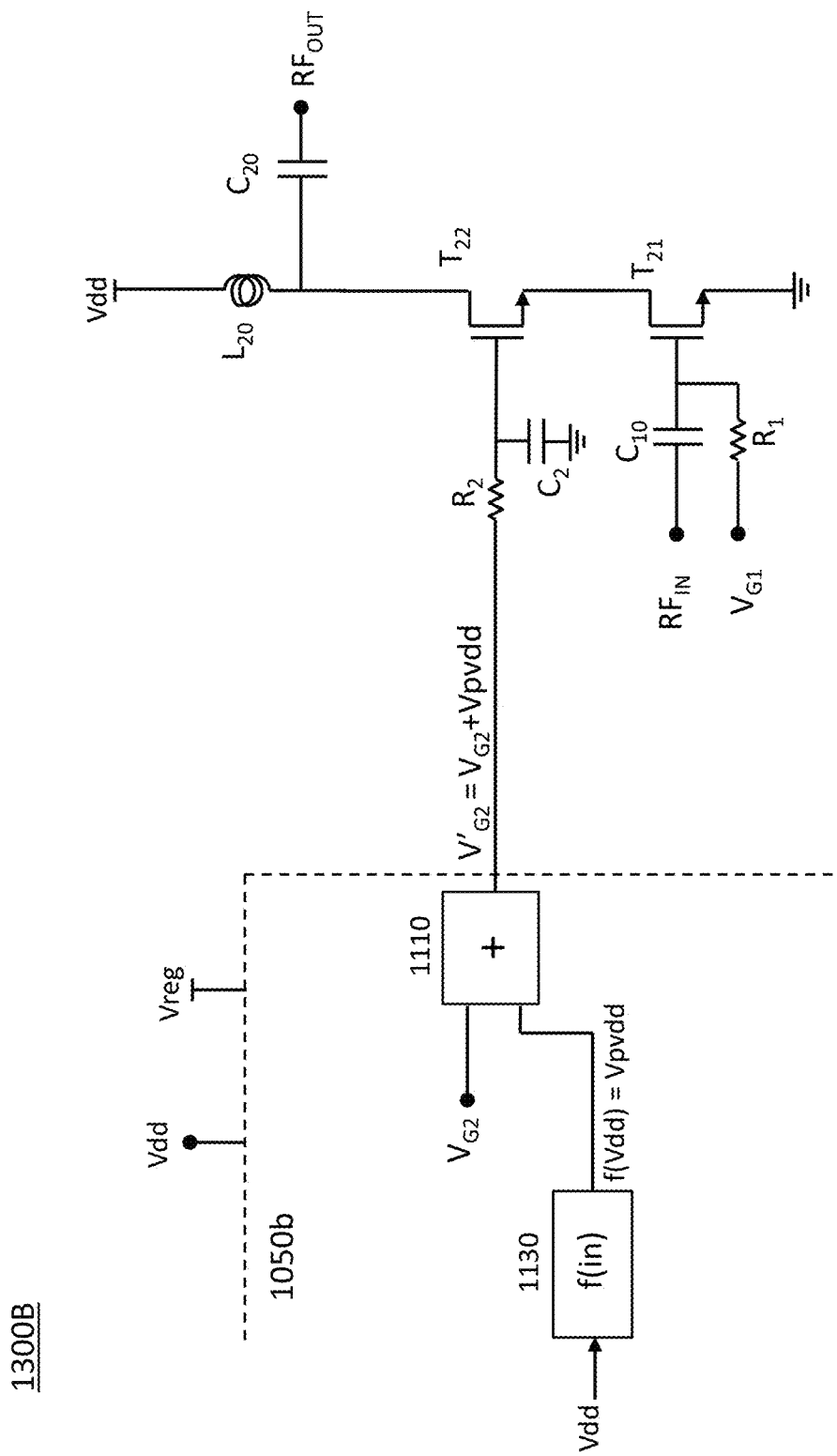
FIG. 13B is a simplified schematic representation according to an exemplary embodiment of the present disclosure of an RF power amplifier with a voltage based compensation circuit that can be used to compensate the output power of the amplifier with respect to a varying supply voltage to the amplifier.
Figure 13C:
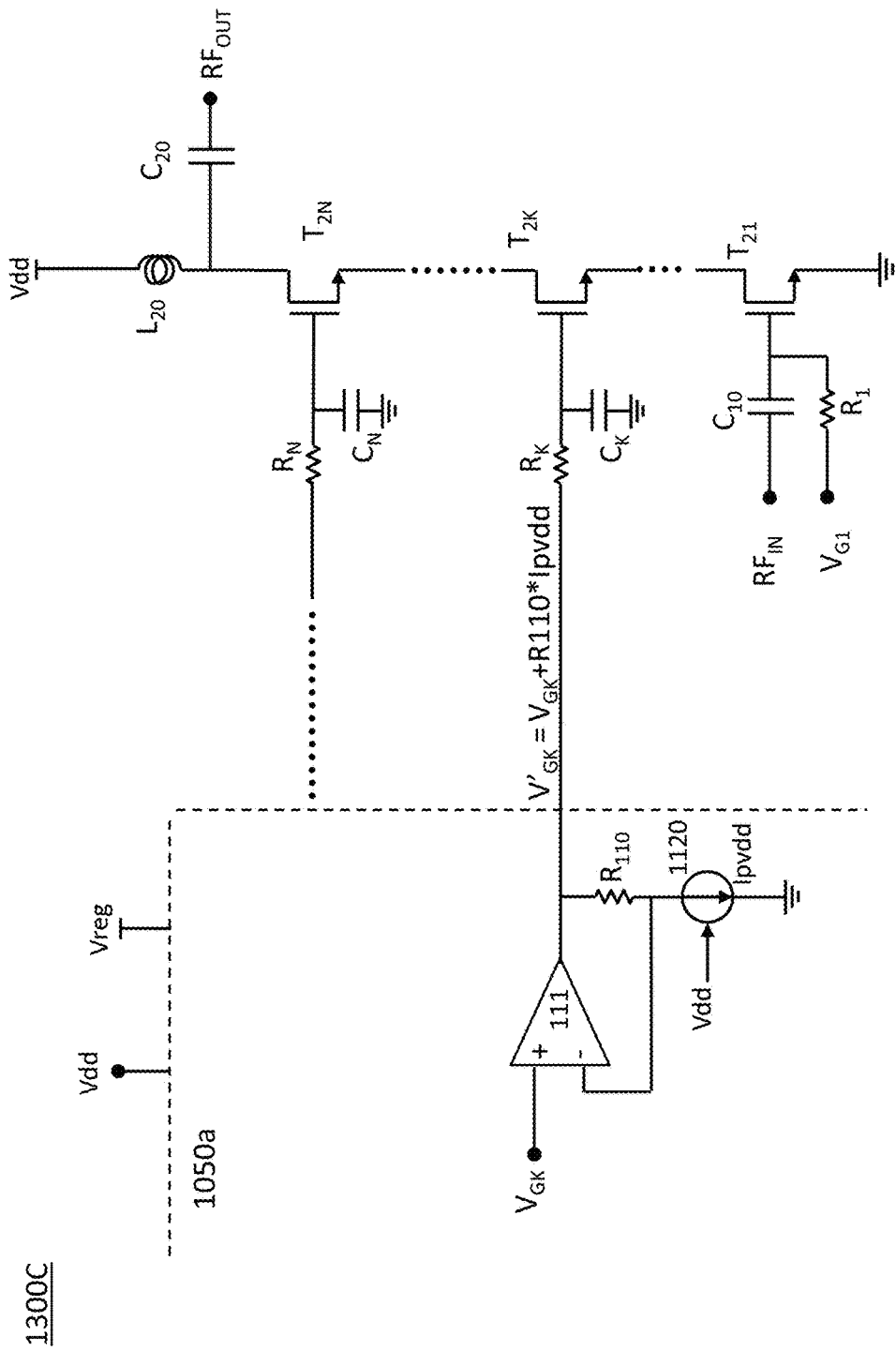
FIG. 13C is a simplified schematic representation according to an exemplary embodiment of the present disclosure of an RF power amplifier with a current based compensation circuit that can be used to compensate the output power of the amplifier with respect to a varying supply voltage to the amplifier.

FIG. 12B are graphs representing output power compensation of the amplifier (1100) of FIG. 11 with respect to the varying supply voltage to the amplifier shown in FIG. 12A. A first graph, G1201, shows the compensated output power, Pout, a second graph, G1202, shows the gate voltage, VG2, that provides the compensated output power, Pout, and a third graph, G1203, shows a second order polynomial curve that fits the second graph. In other words, by varying the gate voltage, VG2, as a function of the varying supply voltage, according to the graph G1202, the output power, Pout, can be compensated to be maintained within a range of about 0.2 dB as represented by the graph G1201, as opposed to the range of about 3 dB defined by points (C, B) of FIG. 12A. Precision in control of the output power, and therefore a performance of the compensation, can be based on how close an effective gate voltage is to the voltage represented by the graph G1202. A person skilled in the art is well aware about practicality of using curve fitting algorithms that can provide a function whose curve (i.e. graph) closely represents, or passes through, points of a graph, such as the graph G1202. As shown in FIG. 12B, and according to an exemplary embodiment of the present disclosure, a second order (quadratic) polynomial function may be used to fit the graph G1202. Such function may be used to compensate the output power, Pout, of the amplifier (1100) with respect to the varying supply voltage, Vdd, by adding and/or subtracting a correction/compensation voltage to a nominal gate voltage (e.g. 0.74 volts) as shown in FIGS. 13A, 13B, and 13C later described. According to one embodiment of the present disclosure, such curve fitting and resultant fitting function may be implemented via one or more of analog and digital circuits in the output control & compensation module (1050) discussed above with reference to FIG. 10.

Figure 12C:
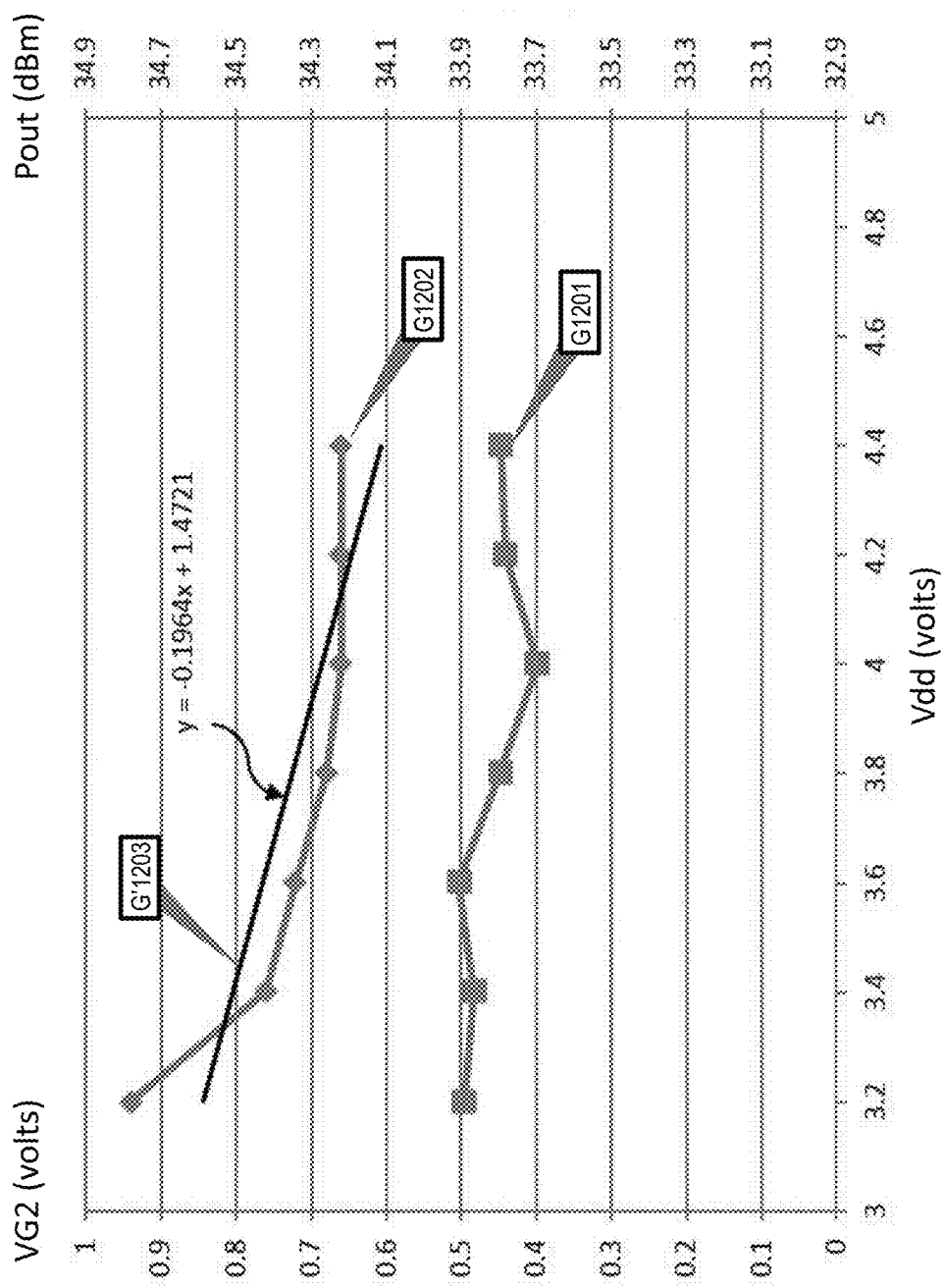
FIG. 12C are graphs representing output power compensation of the amplifier of FIGS. 13A and 13B with respect to the varying supply voltage to the amplifier. A first graph shows the compensated output power, a second graph shows an optimal gate voltage that can provide an optimal compensated output power, and a third graph shows a linear curve fit of the optimal gate voltage that is used by the current and/or voltage compensation circuit to obtain the compensated output power.
Figure 14:
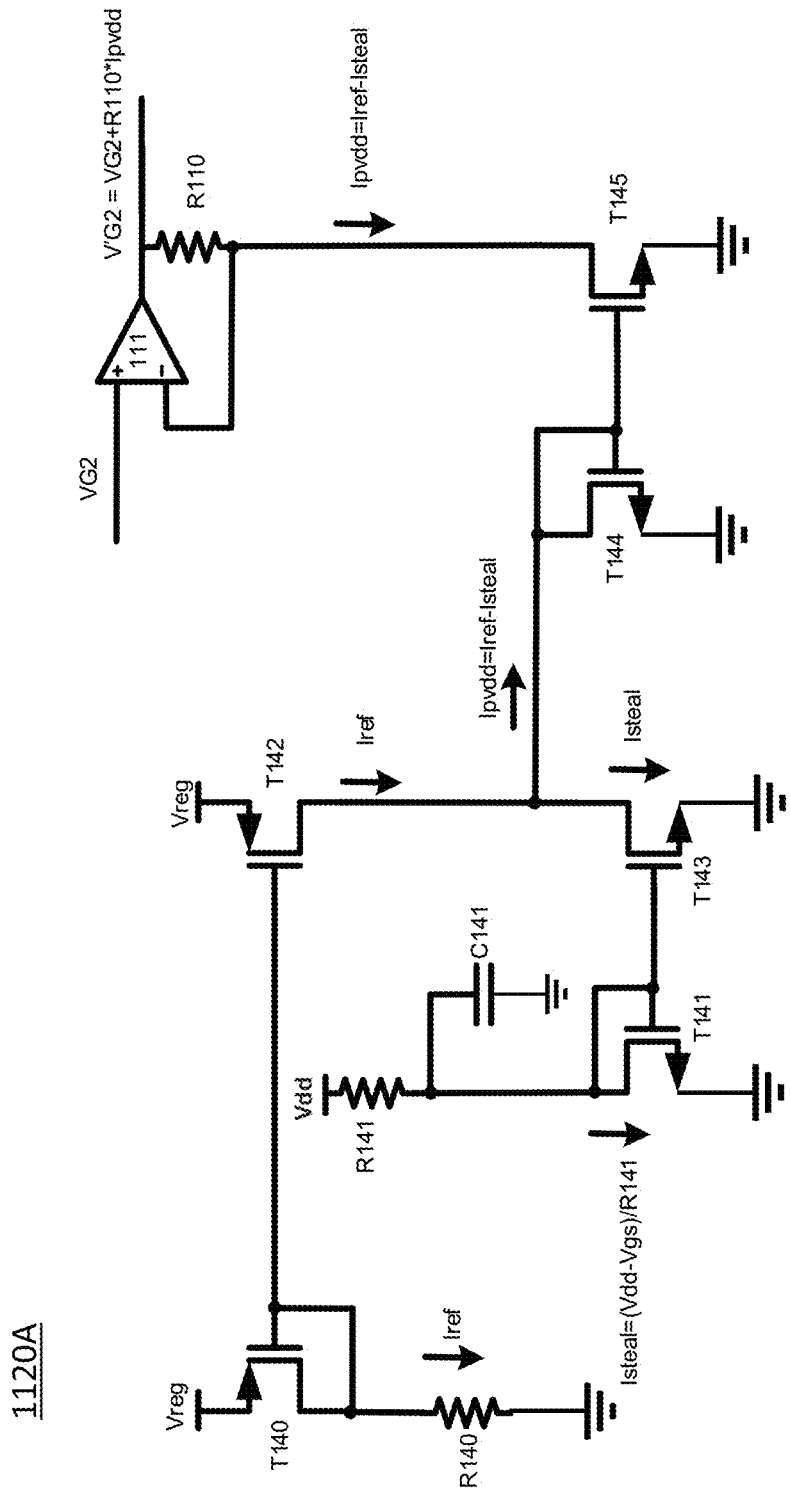
FIG. 14 is a simplified schematic representation according to an exemplary embodiment of the present disclosure of a current based compensation circuit that can be used in the RF power amplifier of FIG. 13A.

With further reference to FIG. 12B, a person skilled in the art would realize that other fitting functions may be used to fit the graph G1202. A more complex fitting function may result in a more precise output power compensation, but also, in a more complex compensation circuit to implement the fitting function. Through simulation and practical testing, applicant of the present disclosure has found that an acceptable compensation can be obtained by using a simple linear function to fit the graph G1202. This is shown in FIG. 12C, where a linear function represented by graph G' 1203 is used to fit the graph G1202. As a result, a different compensated output power, Pout, may be obtained, which as can have a range of variation that may still be acceptable (see discussion below with reference to FIGS. 15A and 15B). It follows that an exemplary compensation circuit according to the present disclosure may use a linear function of a supply voltage (e.g. Vdd of FIG. 11) to an RF amplifier (e.g. 1100 of FIG. 11) to approximate a gate voltage (e.g. V'G2 of FIG. 11) that controls the output power, Pout, of the amplifier so to compensate the output power with respect to variation of the supply voltage. An exemplary implementation according to the present disclosure of a compensation circuit based on a linear function with respect to the supply voltage, Vdd, is shown in FIG. 14 later described.

FIG. 13A is a simplified schematic representation according to an exemplary embodiment of the present disclosure of an RF power amplifier (1300A) with a current based analog compensation circuit that can be used to compensate the output power, Pout, of the amplified output RF signal, RFout, of the amplifier with respect to variations of the supply voltage, Vdd, to the amplifier. As can be seen in FIG. 13A, the current based analog compensation circuit includes an operational amplifier (111), a resistor R110, and a current source (1120). The current source (1120) generates a current Ipvdd that is forced through the resistor R110 to create a voltage drop equal to R110*Ipvdd. This results in an output voltage, V'G2, of the operational amplifier (111) that is equal to the input voltage, VG2, to the operational amplifier (111), plus the voltage across the resistor R110. In other words, and as shown in FIG. 13A, V'G2=VG2+R0*Ipvdd. As a result, a correction/compensation voltage equal to R110*Ipvdd is added to the nominal gate voltage, VG2, so to compensate for a drift of the output power, Pout, with respect to a variation of the supply voltage, Vdd.

With further reference to FIG. 13A, the current source (1120) is designed to output a current Ipvdd that is a function of the supply voltage, Vdd, so that V'G2=VG2+ƒ (Vdd) can be represented by a graph (e.g. G1203, G'1203 of FIGS. 12B, 12C) that fits the graph G1202 of FIGS. 12B, and 12C. In the exemplary embodiment depicted in FIG. 13A, the function ƒ (Vdd) is equal to R110*Ipvdd, where the current Ipvdd is generated by the current source (1120) as a function of Vdd. An exemplary embodiment of the current source (1120) is shown in FIG. 14 later described.

FIG. 13B is a simplified schematic representation according to an exemplary embodiment of the present disclosure of an RF power amplifier (1300B) with a voltage based analog compensation circuit that can be used to compensate the output power, Pout, of the amplified output RF signal, RFout, of the amplifier with respect to variations of the supply voltage, Vdd, to the amplifier. As can be seen in FIG. 13B, the voltage based analog compensation circuit includes a summation block (1110), and a compensation/correction voltage generation (analog circuit) block (1130). The voltage generation block (1130) generates an output voltage, ƒ (Vdd)=Vpvdd, that is a function of the supply voltage Vdd, which is provided to an input terminal of the summation block (1110) for combination (summation) with the voltage VG2 that is provided to another input terminal of the summation block (1110). This results in an output voltage, V'G2, of the summation block (1110) that is equal to the voltage, VG2, plus the voltage Vpvdd. In other words, and as shown in FIG. 13B, V'G2=VG2+Vpvdd. As a result, a correction/compensation voltage equal to Vpvdd is added to the nominal gate voltage, VG2, so to compensate for a drift (i.e. variation) of the output power, Pout, with respect to a variation of the supply voltage, Vdd. It should be noted that a person skilled in the art would know of many exemplary implementations of the summation block (1110), for example, via analog components, such as operational amplifiers and/or transistors. Detailed description of such exemplary implementations is therefore outside the scope of the present disclosure.

As described above, the transistor stack of the RF power amplifier according to the present disclosure may include a plurality of cascode transistors (T22, . . . , T2N), where a correction/compensation voltage of an analog compensation circuit according to the present teachings may be applied by way of a gate terminal of any of the cascode transistors (T22, . . . , T2N), as exemplified in FIG. 13C. In the exemplary embodiment depicted in FIG. 13C, the transistor stack comprises N transistors (T21, T22, . . . , T2N), and a compensation circuit, similar to one described above with reference to FIG. 13A, that is coupled to the gate of the cascode transistor T2K, so to provide a correction/compensation voltage, V'GK, that is based on a voltage level of the supply voltage, Vdd, to thereby compensate for a drift of the output power, Pout, with respect to a variation of the supply voltage. Although FIG. 13C shows compensation via the current based analog compensation circuit as described with reference to FIG. 13A, the voltage based analog compensation circuit described with reference to FIG. 13B may also be used.

A person skilled in the art would realize that the combining of the compensation/correction voltages, such as the voltage R110*Ipvdd of FIG. 13A and the voltage Vpvdd of FIG. 13B, with the nominal gate voltage VG2, need not necessarily be by way of an addition as depicted in the non-limiting circuits of FIGS. 13A and 13B, as subtraction of the compensation/correction voltages may also be envisioned. Also, a person skilled in the art would find many analog circuit implementation examples that can be used to combine a compensation/correction voltage based on a varying value of the supply voltage, Vdd, with the nominal gate voltage VG2, so to maintain a substantially constant output power, Pout, the compensation/correction voltage being based on a curve fit algorithm as described above with reference to FIGS. 12B and 12C.

FIG. 14 shows an exemplary implementation according to the present disclosure of a current source (1120A) that can be used as the current source (1120) in the current based compensation circuit of FIG. 13A. The exemplary current source (1120A) is designed to provide a compensation/correction voltage, R110*Ipvdd, that is a linear function of the supply voltage, Vdd, using analog only components, such as transistors (T141, . . . , T145), and a reference stable (e.g. regulated) voltage provided by a supply voltage Vreg.

Principle of operation of the exemplary current source (1120A) is provided in the following five steps:

Step (1): A current, Iref, is generated from a regulated supply, Vreg, in a first leg (T140, R140) of a first current mirror circuit (T140, T142, R140), where Iref=(Vreg−Vgs)/R140 and Vgs is the gate-to-source voltage of the transistor T140. The current Iref is mirrored in a second leg (T142) of the first current mirror.

Step (2): A current, Isteal, that is directly proportional to Vdd is generated in a first leg of a second current mirror (T141, T143, R141, C141), where Isteal=(Vdd−Vgs)/R141 and Vgs is the gate-to-source voltage of the transistor T141 (may be substantially equal to Vgs of T140). Accordingly, Isteal increases when Vdd increases, and Isteal decreases when Vdd decreases. The current Isteal is mirrored in a second leg (T143) of the second current mirror. An optional capacitor C141 may be used to provide, in combination with the resistor R141, a low pass filter to reduce effects of higher frequency components that may be coupled to the supply voltage Vdd. According to an exemplary embodiment of the present disclosure, such low pass filter may provide a cutoff frequency of about 100 kHz.

Step (3): As the transistor T142 of the second leg of the first current mirror is in series connection with the transistor T143 of the second leg of the second current mirror, a difference current, Ipvdd=Iref−Isteal, is generated and routed to a first leg of a third current mirror (T144, T145). The current Ipvdd is mirrored in a second leg (T145) of the third current mirror. Since Iref is constant and Isteal is a linear function of the supply voltage Vdd, Ipvdd is also a linear function of the supply voltage with a slope that is opposite a slope of Isteal.

Step (4): The current Ipvdd is dropped across a resistor R110 that is in series connection with the second leg transistor T145 of the third current mirror, to create an input offset voltage around an operational amplifier (111) configured as a voltage follower. The input offset voltage, i.e. the compensation/correction voltage, being equal to R110*Ipvdd, is therefore a linear function with respect to the supply voltage Vdd, with a slope that is opposite the slope of Isteal.

Step (5): The input offset voltage around the operational amplifier follower circuit forces its output to be V'G2=VG2+Iptvdd*R110.

With continued reference to the exemplary current source (1120A) of FIG. 14, the slope of the linear function that provides the compensation/correction voltage, R110*Ipvdd, is opposite the slope of the Isteal current that is generated by the second current mirror (T141, T143, R141, C141). According to a further embodiment of the present disclosure, the slope of the compensation/correction voltage can be programmable and/or adjustable by making the value of the resistor R141 programmable and/or adjustable. A person skilled in the art would know of various implementation examples for providing such programmable and/or adjustable resistor by way of digital and/or analog circuits. In a case where an analog only circuit is desired, exemplary implementations of an adjustable resistor may include resistor banks (arrays) coupled to FET switches to provide selective discrete resistance values, or a FET ON resistance that continuously varies as a function of an applied voltage to the FET. Such adjustable value of the slope of the compensation/correction voltage can in turn allow to fine tweak, e.g. minimize, output power variation with respect to the supply voltage Vdd.

Figure 15A:
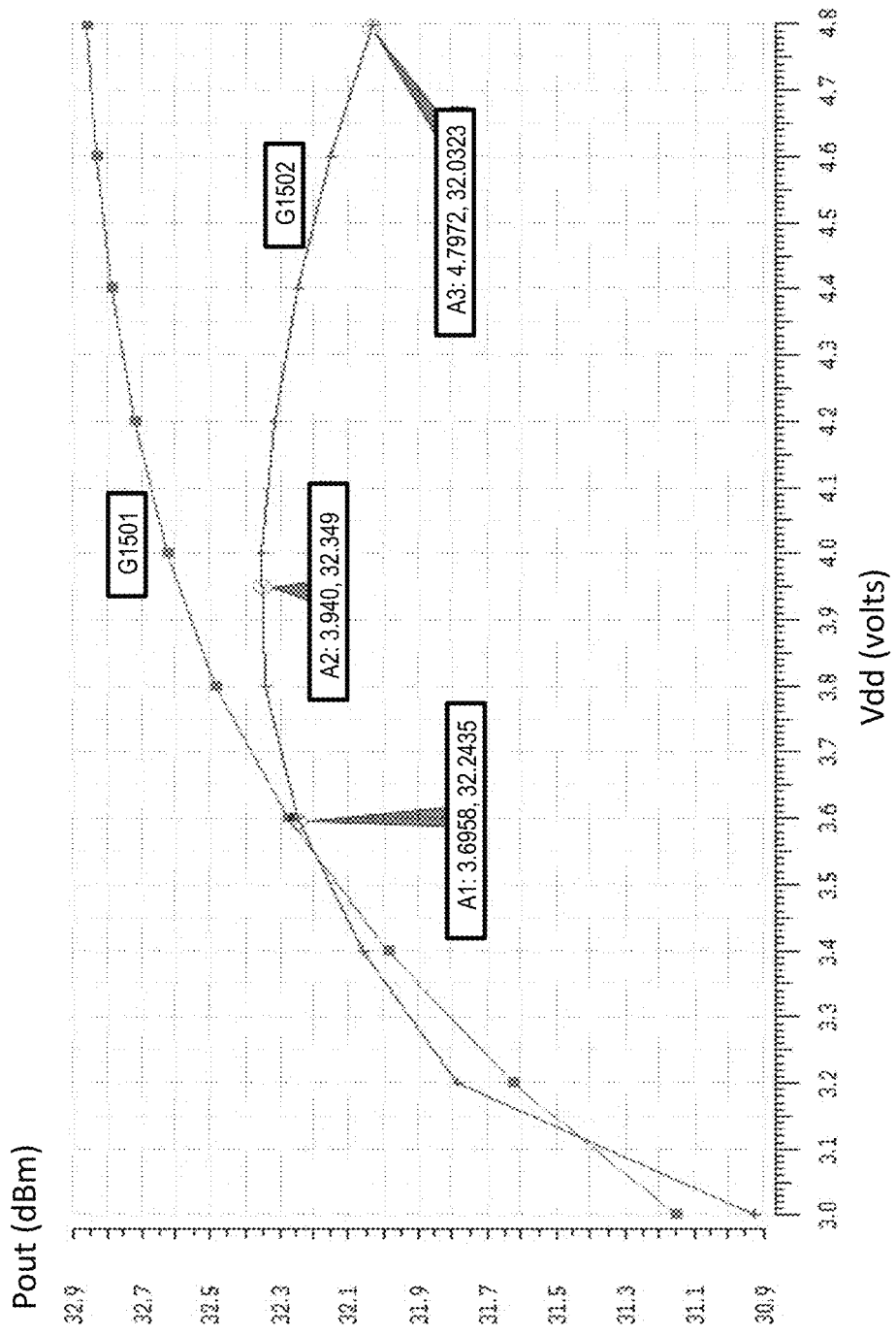
FIG. 15A are graphs representing simulated output power of the RF amplifier of FIG. 11 and of the RF amplifiers of FIGS. 13A and 13B.

FIG. 15A are graphs representing simulated output power, Pout, of the RF amplifier of FIG. 11, G1501, and of the RF amplifiers of FIGS. 13A and 13B, G1502, using a compensation circuit that provides a compensation/correction that is based on a linear function (e.g. 1120A of FIG. 14) with respect to the supply voltage Vdd. As can be seen in the graph G1501 of FIG. 5A, when no compensation is provided, the output power, Pout, varies 0.75 dB when Vdd varies from 3.6 volts to 4.8 volts. On the other hand, as shown in the graph G1502 of FIG. 5A, when a linear compensation is provided, Pout only varies by about 0.3 dB when Vdd varies from 3.6 volts to 4.8 volts. A person skilled in the art would realize that a compensation circuit, such as one described in reference to FIG. 14, can be made to be selectively enabled or disabled in dependence of a desired mode of operation, where in the disabled mode, the compensation/correction voltage is substantially zero.

Figure 15B:
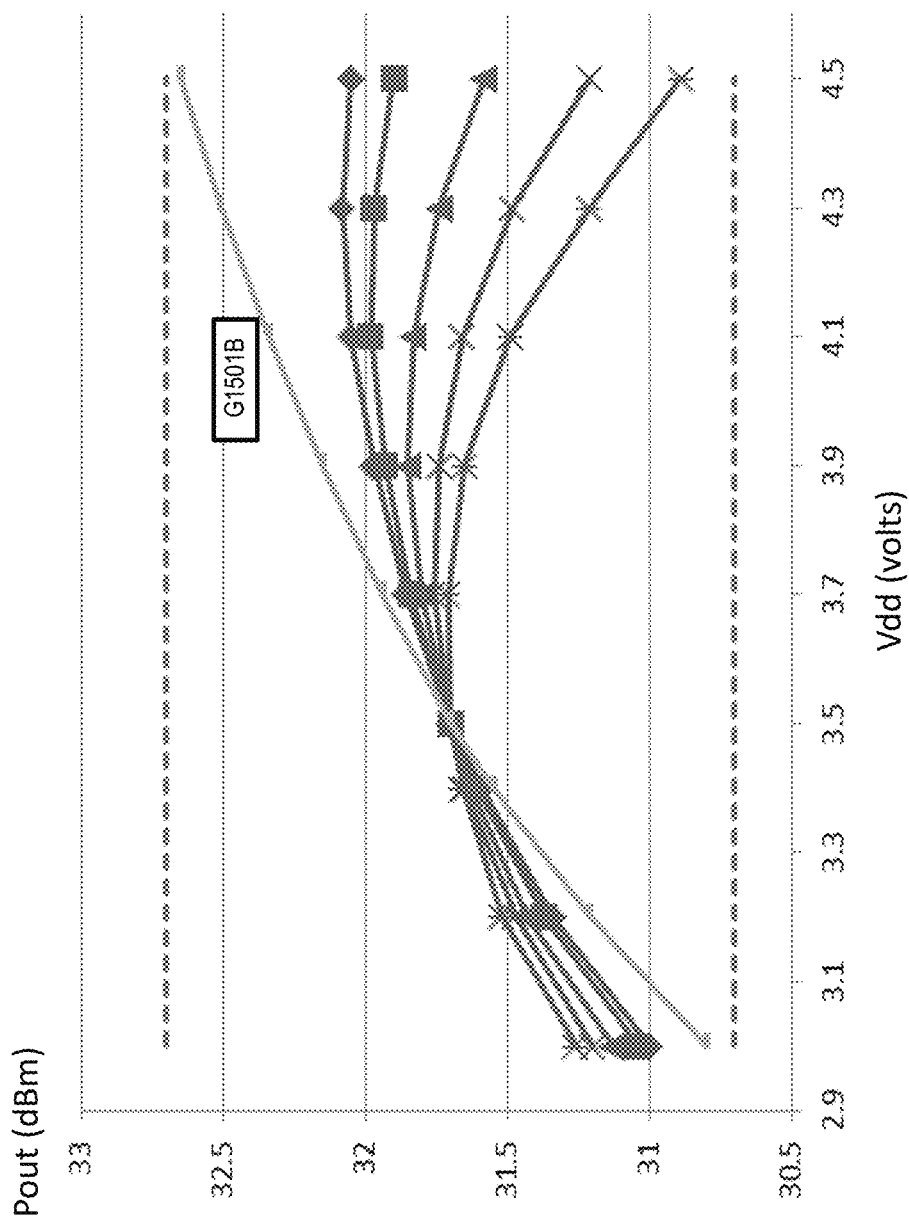
FIG. 15B are graphs representing output power compensation of the RF amplifiers of FIGS. 13A and 13B based on linear curve fits having different slopes.

FIG. 15B are graphs representing output power compensation of the RF amplifiers of FIGS. 13A and 13B based on linear curve fits having different slopes, which can be provided, as discussed above, by way of a programmable and/or adjustable compensation slope. A graph G1501B represents the output power variation in the absence of a compensation (e.g. disabled), whereas all other graphs represent respective output power variation with respect to compensations using a different slope. As can be seen in FIG. 15B, varying the slope of the compensation circuit can reduce a total range of variation of the output power within a selected range of the supply voltage Vdd.

Figure 16:
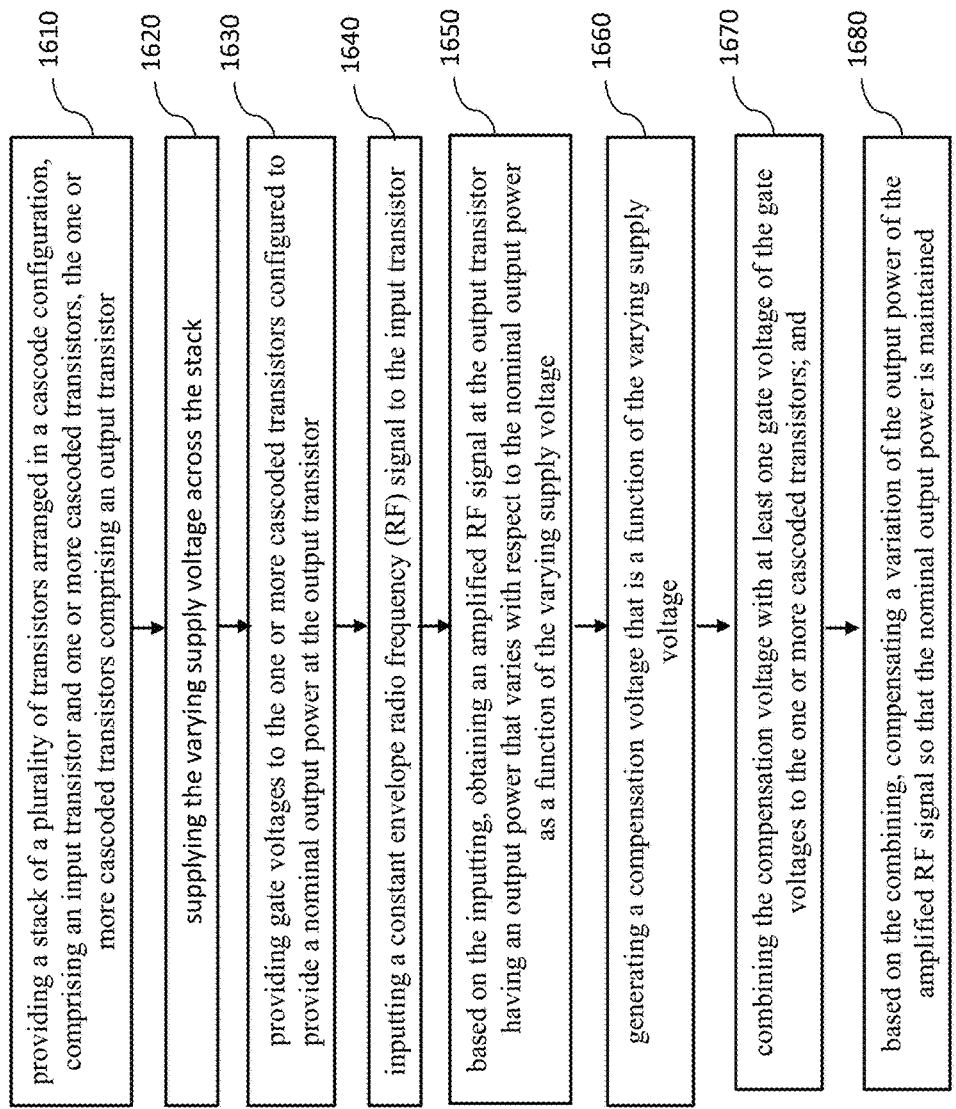
FIG. 16 is a process chart showing a method for compensating an output power of an amplifier arrangement with respect to variation of a supply voltage.

FIG. 16 is a process chart (1600) showing various steps of a method for compensating a variation of an output power of an amplifier arrangement operating from a varying supply voltage. As can be seen in the process chart (1600), the method comprises: providing a stack of a plurality of transistors arranged in a cascode configuration, comprising an input transistor and one or more cascoded transistors, the one or more cascoded transistors comprising an output transistor, per step (1620); supplying the varying supply voltage across the stack, per step (1620); providing gate voltages to the one or more cascoded transistors configured to provide a nominal output power at the output transistor, per step (1630); inputting a constant envelope radio frequency (RF) signal to the input transistor, per step (1640); based on the inputting, obtaining an amplified RF signal at the output transistor having an output power that varies with respect to the nominal output power as a function of the varying supply voltage, per step (1650); generating a compensation voltage that is a function of the varying supply voltage, per step (1660); combining the compensation voltage with at least one gate voltage of the gate voltages to the one or more cascoded transistors, per step (1670); and based on the combining, compensating a variation of the output power of the amplified RF signal so that the nominal output power is maintained, per step (1680).

A person skilled in the art may apply the present teachings to a variety of different amplifier designs that use the same basic concept of varying one or more gate voltages of the cascoded transistors (T22, T23, . . . , T2N) in order to control and/or compensate the output power of an amplifier that operates from a substantially fixed drain voltage (e.g. Vbatt) at the output transistor (T2N) to amplify a constant amplitude RFin signal. Such teachings allow design of such amplifiers with a reduced size pass device (120), as shown in FIGS. 4A, 4B, 6, 7 and 8, or alternatively, without the need of any pass device, as shown in FIG. 9. In one exemplary case, the present teachings have allowed a reduction of 20% in die size of an RF power amplifier (GSM) when compared to a traditional design approach (e.g. per FIGS. 1-3) while maintaining a same performance characteristic (linearity, dynamic range) of the RF amplifier. Increased PAE for a given range of the Vramp power control voltage can be attributed to the removal of the large size pass device (120) from the main current conduction path of the stacked transistors (T21, T22, . . . , T2N), where a high current (e.g. 2 amps and over) through the pass device (120) of the traditional design approach may cause a power loss in the pass device (120). The person skilled in the art may also apply the present teachings to a variety of power management applications where pass devices are used in a main conduction path of stacked transistors of a power management circuit; by removing the (large size) pass devices from the main conduction path and controlling an output power via gate bias voltages to one or more cascoded devices of the stacked transistors, a substantial reduction in size of the overall power management circuit may be obtained.

The term "MOSFET" technically refers to metal-oxide-semiconductors; another synonym for MOSFET is "MISFET", for metal-insulator-semiconductor FET. However, "MOSFET" has become a common label for most types of insulated-gate FETs ("IGFETs"). Despite that, it is well known that the term "metal" in the names MOSFET and MISFET is now often a misnomer because the previously metal gate material is now often a layer of polysilicon (polycrystalline silicon). Similarly, the "oxide" in the name MOSFET can be a misnomer, as different dielectric materials are used with the aim of obtaining strong channels with smaller applied voltages. Accordingly, the term "MOSFET" as used herein is not to be read as literally limited to metal-oxide-semiconductors, but instead includes IGFETs in general.

As should be readily apparent to one of ordinary skill in the art, various embodiments of the invention can be implemented to meet a wide variety of specifications. Unless otherwise noted above, selection of suitable component values is a matter of design choice and various embodiments of the invention may be implemented in any suitable IC technology (including but not limited to MOSFET and IGFET structures), or in hybrid or discrete circuit forms. Integrated circuit embodiments may be fabricated using any suitable substrates and processes, including but not limited to standard bulk silicon, silicon-on-insulator (SOI), silicon-on-sapphire (SOS), GaN HEMT, GaAs pHEMT, and MESFET technologies. However, the inventive concepts described above are particularly useful with an SOI-based fabrication process (including SOS), and with fabrication processes having similar characteristics. Fabrication in CMOS on SOI or SOS enables low power consumption, the ability to withstand high power signals during operation due to FET stacking, good linearity, and high frequency operation (in excess of about 10 GHz, and particularly above about 20 GHz). Monolithic IC implementation is particularly useful since parasitic capacitances generally can be kept low (or at a minimum, kept uniform across all units, permitting them to be compensated) by careful design.

Voltage levels may be adjusted or voltage and/or logic signal polarities reversed depending on a particular specification and/or implementing technology (e.g., NMOS, PMOS, or CMOS, and enhancement mode or depletion mode transistor devices). Component voltage, current, and power handling capabilities may be adapted as needed, for example, by adjusting device sizes, serially "stacking" components (particularly FETs) to withstand greater voltages, and/or using multiple components in parallel to handle greater currents. Additional circuit components may be added to enhance the capabilities of the disclosed circuits and/or to provide additional functional without significantly altering the functionality of the disclosed circuits.

A number of embodiments of the invention have been described. It is to be understood that various modifications may be made without departing from the spirit and scope of the invention. For example, some of the steps described above may be order independent, and thus can be performed in an order different from that described. Further, some of the steps described above may be optional. Various activities described with respect to the methods identified above can be executed in repetitive, serial, or parallel fashion. It is to be understood that the foregoing description is intended to illustrate and not to limit the scope of the invention, which is defined by the scope of the following claims, and that other embodiments are within the scope of the claims.

The invention claimed is:

1. A circuital arrangement comprising:
a stack of a plurality of transistors arranged in a cascode configuration, comprising:
(i) an input transistor adapted to receive an input radio frequency (RF) signal; and
(ii) one or more cascoded transistors, the one or more cascoded transistors comprising an output transistor adapted to output, at an adjustable output power, an output RF signal based on the input RF signal, and
a compensation circuit adapted to generate a compensation voltage that is a function of a supply voltage to the stack that is a varying supply voltage,
wherein:
a variation of the adjustable output power with respect to the varying supply voltage is compensated for by varying at least one gate voltage of the one or more cascoded transistors of the stack according to a variable voltage level of the varying supply voltage, and
the at least one gate voltage is a combination of the compensation voltage and a nominal gate voltage that is configured to provide a nominal output power of the adjustable output power.

2. The circuital arrangement according to claim 1, wherein the combination of the compensation voltage and the nominal gate voltage is according to a function of the variable supply voltage that approximates an optimal non-linear function of the variable supply voltage that cancels the variation of the adjustable output power.

3. The circuital arrangement according to claim 2, wherein the function of the variable supply voltage is one of: a) a linear function, and b) a polynomial function.

4. The circuital arrangement according to claim 1, wherein the compensation voltage is based on a current generation circuit that generates a compensation current that is a function of the varying supply voltage.

5. The circuital arrangement according to claim 4, wherein the compensation circuit comprises:
a resistor; and
the current generation circuit;
wherein the resistor is in series connection with an output of the current generation circuit so that a flow of the compensation current through the resistor generates the compensation voltage.

6. The circuital arrangement according to claim 5, wherein the compensation circuit further comprises an operational amplifier that is configured to combine the compensation voltage and the nominal gate voltage according to one of: a) an addition of the compensation voltage to the nominal gate voltage, and b) a subtraction of the compensation voltage from the nominal gate voltage.

7. The circuital arrangement according to claim 4, wherein the current generation circuit comprises a difference circuit that is configured to generate a difference between a substantially constant current and a varying current that is a function of the varying supply voltage.

8. The circuital arrangement according to claim 7, wherein the difference circuit comprises:
a first current mirror coupled to a substantially constant reference voltage through a first leg of the first current mirror so to generate the substantially constant current; and a second current mirror coupled to the varying supply voltage through a first leg of the second current mirror so to generate the varying current, wherein respective second legs of the first and the second current mirror are in series connection so to generate the difference between the substantially constant current and the varying current.

9. The circuital arrangement according to claim 1, further comprising one or more gate capacitors each connected between a gate of a transistor of the one or more cascoded transistors and a reference potential, wherein the each gate capacitor is configured to allow a gate voltage at the gate to vary along with an RF voltage at a drain of the transistor.

10. The circuital arrangement according to claim 9, wherein the one or more gate capacitors are configured to substantially equalize an RF voltage of the output RF signal at a drain of the output transistor across the plurality of transistors of the stack.

11. The circuital arrangement according to claim 1, wherein the at least one gate voltage comprises two or more gate voltages of the one or more cascoded transistors.

12. The circuital arrangement according to claim 1, wherein the at least one gate voltage comprises a gate voltage of the output transistor.

13. The circuital arrangement according to claim 1, wherein the at least one gate voltage comprises a gate voltage of a transistor of the one or more cascoded transistors that is directly coupled to the input transistor.

14. The circuital arrangement according to claim 1, further comprising:
a first resistor tree comprising a plurality of series connected resistors; and
a low dropout (LDO) regulator coupled to the first resistor tree,
wherein:
a node of the first resistor tree is configured to provide the nominal gate voltage of the at least one gate voltage, and
a control voltage to the LDO regulator varies the at least one gate voltage to provide the nominal output power from the stack.

15. The circuital arrangement according to claim 1, further comprising:
a gate voltage control module coupled to gates of the one or more transistors of the stack,
wherein:
the gate voltage control module is configured to provide, based on a control voltage, the nominal gate voltage of the at least one gate voltage independently from remaining gate voltages of the one or more transistors of the cascoded transistors of the stack.

16. The circuital arrangement according to claim 1, wherein the plurality of transistors are metal-oxide-semiconductor (MOS) field effect transistors (FETs), or complementary metal-oxide-semiconductor (CMOS) field effect transistors (FETs).

17. The circuital arrangement according to claim 16, wherein the plurality of transistors are fabricated using one of: a) silicon-on-insulator (SOI) technology, and b) silicon-on-sapphire technology (SOS).

18. The circuital arrangement according to claim 1, wherein the varying supply voltage to the stack is a substantially fixed supply voltage.

19. The circuital arrangement according to claim 18, wherein the substantially fixed supply voltage is a battery voltage.

20. A method for compensating a variation of an output power of an amplifier arrangement operating from a varying supply voltage, the method comprising:
providing a stack of a plurality of transistors arranged in a cascode configuration, comprising an input transistor and one or more cascoded transistors, the one or more cascoded transistors comprising an output transistor;
supplying the varying supply voltage across the stack;
providing gate voltages to the one or more cascoded transistors configured to provide a nominal output power at the output transistor;
inputting a constant envelope radio frequency (RF) signal to the input transistor;
based on the inputting, obtaining an amplified RF signal at the output transistor having an output power that varies with respect to the nominal output power as a function of the varying supply voltage;
generating a compensation voltage that is a function of the varying supply voltage;
combining the compensation voltage with at least one gate voltage of the gate voltages to the one or more cascoded transistors; and
based on the combining, compensating a variation of the output power of the amplified RF signal so that the nominal output power is maintained.

21. The method according to claim 20, wherein the compensation voltage is based on a compensation current that is a function of the varying supply voltage.

* * * * *